US012740162B2

(12) United States Patent
Lu et al.

(10) Patent No.: US 12,740,162 B2
(45) Date of Patent: Sep. 15, 2026

(54) OPTOELECRONIC DEVICE WITH POLARIZING MASK STRUCTURE

(71) Applicant: Taiwan Semiconductor Manufacturing Company, Ltd., Hsinchu (TW)

(72) Inventors: Chun-Liang Lu, Tainan City (TW); Wei-Lin Chen, Tainan City (TW); Chun-Hao Chou, Tainan City (TW); Kuo-Cheng Lee, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 472 days.

(21) Appl. No.: 18/326,923

(22) Filed: May 31, 2023

(65) Prior Publication Data

US 2024/0405053 A1 Dec. 5, 2024

(51) Int. Cl.
*H10F 39/18* (2025.01)
*H10F 39/00* (2025.01)

(52) U.S. Cl.
CPC ......... *H10F 39/184* (2025.01); *H10F 39/014* (2025.01)

(58) Field of Classification Search
CPC .... H10F 39/184; H10F 39/014; H10F 39/024; H10F 39/182; H10F 39/8053; H10F 39/8063
See application file for complete search history.

(56) References Cited

U.S. PATENT DOCUMENTS 10,181,485 B2 1/2019 Tatani et al.
10,341,576 B2 * 7/2019 Schubert ................. G01J 3/447
2009/0323060 A1 * 12/2009 Knipp ....................... G01J 3/12 977/773
2012/0104409 A1 * 5/2012 Chu .................... H01L 21/0265 438/46

(Continued)

FOREIGN PATENT DOCUMENTS

CN 101218522 B * 6/2012 ................ G01J 4/04
CN 106133912 A 11/2016

(Continued)

*Primary Examiner* — Mohammed Shamsuzzaman
(74) *Attorney, Agent, or Firm* — Harrity & Harrity, LLP

(57) ABSTRACT

Some implementations described herein include a complementary metal oxide semiconductor image sensor device and techniques to form the complementary metal oxide semiconductor image sensor device. The complementary metal oxide semiconductor image sensor device includes a includes a first array of photodiodes stacked over a second array of photodiodes. A polarization structure is between the first array of photodiodes and the second array of photodiodes. Signaling generated by the first array of photodiodes (e.g., signaling corresponding to unpolarized light waves) may be multiplexed with signaling generated by the second array of photodiodes (e.g., signaling corresponding to polarized light waves). The complementary metal oxide semiconductor image sensor device further includes a filter structure that filters visible light waves and near infrared light waves amongst the first array of photodiodes and the second array of photodiodes.

20 Claims, 29 Drawing Sheets

(56) References Cited

U.S. PATENT DOCUMENTS

| | | | | |
|---|---|---|---|---|
| 2015/0228720 | A1* | 8/2015 | Chen | H01L 21/76256 438/455 |
| 2016/0195429 | A1* | 7/2016 | Boettiger | H04N 25/134 250/208.2 |
| 2016/0322412 | A1 | 11/2016 | Yamamoto et al. | |
| 2018/0052348 | A1* | 2/2018 | Park | G02F 1/13336 |
| 2018/0191932 | A1* | 7/2018 | Schubert | G01J 3/0224 |
| 2021/0175270 | A1* | 6/2021 | Pang | H10F 39/8023 |
| 2023/0123763 | A1* | 4/2023 | Lenchenkov | H04N 25/702 348/222.1 |
| 2024/0201016 | A1* | 6/2024 | Deneuville | G01J 4/04 |
| 2024/0395847 | A1* | 11/2024 | Lin | H10F 39/8053 |

FOREIGN PATENT DOCUMENTS

| | | | | | |
|---|---|---|---|---|---|
| CN | 110190077 | A | | 8/2019 | |
| CN | 110199391 | A | | 9/2019 | |
| CN | 112928130 | A | * | 6/2021 | H04N 25/704 |
| CN | 110740277 | B | * | 6/2022 | H04N 25/76 |
| DE | 102005031966 | A1 | * | 1/2007 | G01J 4/04 |
| FR | 3143779 | A1 | * | 6/2024 | G01J 3/0224 |
| JP | 3372466 | B2 | * | 2/2003 | G02B 5/1809 |
| KR | 20210124073 | A | * | 10/2021 | G02B 5/3058 |
| WO | WO-2015025676 | A1 | * | 2/2015 | H04N 25/134 |
| WO | WO-2017002717 | A1 | * | 1/2017 | H04N 23/843 |

* cited by examiner

200

202

| | | | |
|---|---|---|---|
| 202a | 202b | 202a | 202b |
| 202d | 202c | 202d | 202c |
| 202a | 202b | 202a | 202b |
| 202d | 202c | 202d | 202c |

OPTOELECRONIC DEVICE WITH POLARIZING MASK STRUCTURE

BACKGROUND

A complementary metal oxide semiconductor (CMOS) image sensor may include a plurality of pixel sensors. A pixel sensor of the CMOS image sensor may include a transfer transistor, which may include a photodiode configured to convert photons of incident light into a photocurrent of electrons and a transfer gate configured to control the flow of the photocurrent between the photodiode and a drain region. The drain region may be configured to receive the photocurrent such that the photocurrent can be measured and/or transferred to other areas of the CMOS image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a diagram of an example pixel sensor array described herein.

DETAILED DESCRIPTION

Figure 1:
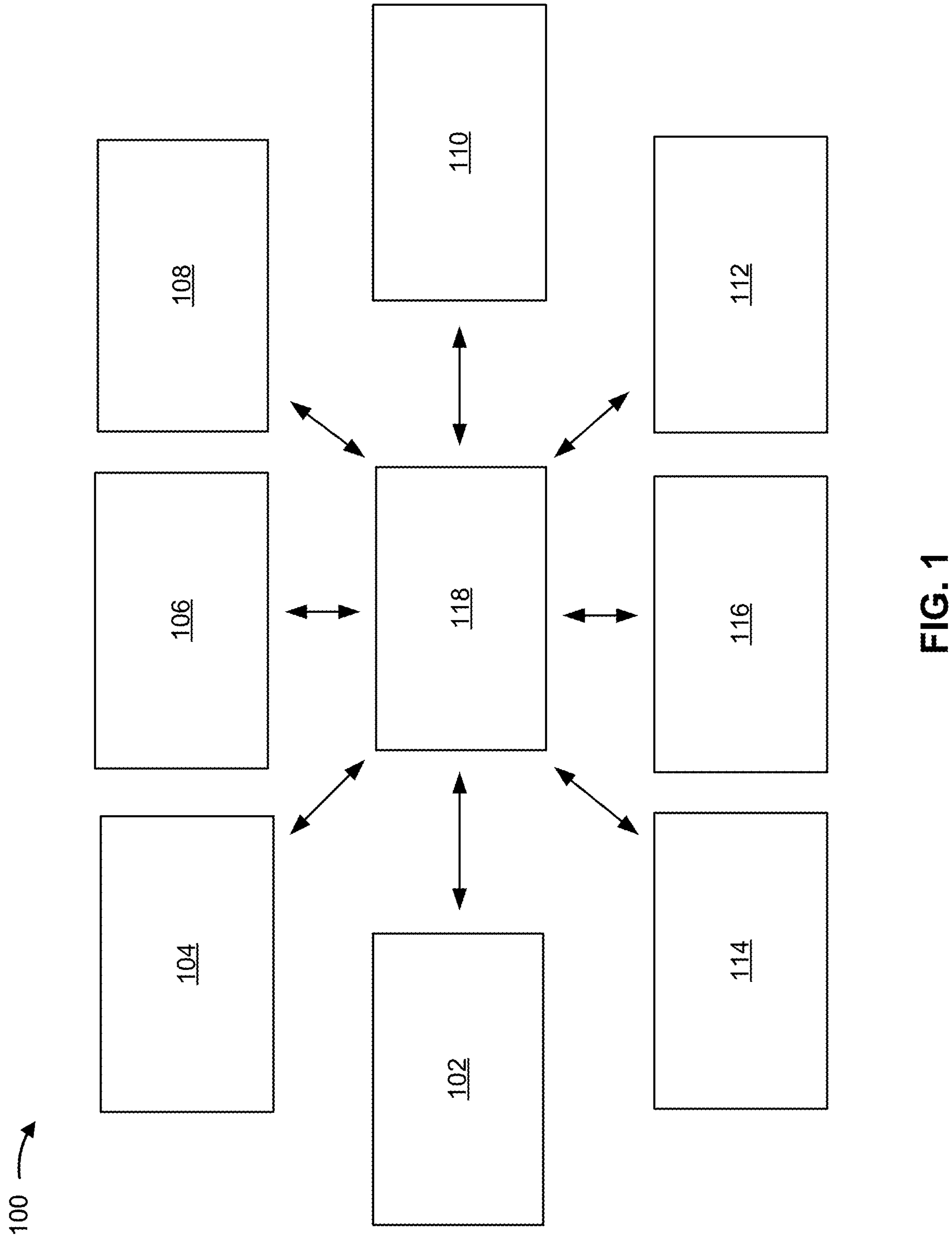
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, complementary metal oxide semiconductor (CMOS) image sensor (CIS) devices utilize light-sensitive CMOS circuitry to convert light energy into electrical energy. The light-sensitive CMOS circuitry may include a photodiode formed in a silicon substrate. As the photodiode is exposed to light, an electrical charge is induced in the photodiode (referred to as a photocurrent). The photodiode may be coupled to a switching transistor, which is used to sample the charge of the photodiode. Colors may be determined by placing filters over the light-sensitive CMOS circuitry.

In some low-lighting applications, an image processing system uses signaling corresponding to unpolarized visible (VIS) light waves (e.g., VIS light waves reflected from a target object) detected by photodiodes of a first discrete CIS device. The image processing system may further use signaling corresponding to unpolarized near infrared (NIR) light waves (e.g., NIR light waves reflected from the target object) detected by photodiodes of a second discrete CIS device. The signaling corresponding to the unpolarized VIS light waves, in combination with the signaling corresponding to the unpolarized NIR light waves, may be insufficient to generate an optical image that accurately represents the target object. Additionally, a separation of the first discrete CIS device and the second discrete CIS device may cause the timing between the signaling corresponding to the unpolarized VIS light waves and the unpolarized NIR light waves to become unsynchronized. The lack of synchronization may decrease an ability of the image processing system to multiplex the signaling with a precision necessary to generate the optical image that accurately represents the target object.

Some implementations described herein include a CIS device and techniques to form the CIS device. The CIS device includes a includes a first array of photodiodes stacked over a second array of photodiodes. A polarization structure is between the first array of photodiodes and the second array of photodiodes. Signaling generated by the first array of photodiodes (e.g., signaling corresponding to unpolarized light waves) may be multiplexed with signaling generated by the second array of photodiodes (e.g., signaling corresponding to polarized light waves). The CIS device further includes a filter structure that distributes VIS light waves and NIR light waves amongst the first array of photodiodes and the second array of photodiodes.

In this way, reflected light waves from a target object that includes unpolarized VIS light waves, polarized VIS light waves, unpolarized NIR light waves, and/or polarized NIR light waves are simultaneously captured by a single CIS device. As such, a performance of an image processing system that multiplexes the simultaneously captured unpolarized VIS light waves, the polarized VIS light waves, the unpolarized NIR light waves, and/or the polarized NIR light waves may be improved relative to another image processing system that multiplexes unpolarized VIS light waves and unpolarized NIR light waves that may be captured by separate and discrete devices with timing offsets. This improved performance results in a reduction of an amount of computing resources needed by the image processing system. Additionally, and by combining unpolarized VIS light detection capabilities, polarized VIS light detection capabilities, unpolarized NIR light detection capabilities, and polarized NIR light detection capabilities in a single CIS device, an amount of semiconductor manufacturing resources needed to manufacture the image processing system is reduced (e.g., semiconductor manufacturing tools, raw materials, manpower, and/or computing resources).

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, an ion implantation tool 114, a bonding/debonding/debonding tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The bonding/debonding/debonding tool 116 is a semiconductor processing tool that is capable of bonding two or more wafers (or two or more semiconductor substrates, or two or more semiconductor devices) together. For example, the bonding/debonding/debonding tool 116 may include a eutectic bonding tool that is capable of forming a eutectic bond between two or more wafers together. In these examples, the bonding tool may heat the two or more wafers to form a eutectic system between the materials of the two or more wafers. As another example, the bonding/debonding tool 116 may include a hybrid bonding tool, a direct bonding tool, and/or another type of bonding tool. In some implementations, the bonding/debonding/debonding tool 116 may separate and/or transfer a layer or a material stack from one substrate to another.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

As described in greater detail in connection with FIGS. 5A-5S, and elsewhere herein, one or more of the semiconductor processing tools 102-116 and/or the wafer/die transport tool 118 may perform a series of one or more semiconductor processing operations. In some implementations, and as an example, the series of one or more semiconductor processing operations includes forming a first photodiode in a layer of a semiconductor material. The series of one or more semiconductor processing operations includes forming a first portion of a dielectric region above the first photodiode. The series of one or more semiconductor processing operations includes forming a polarizing mask structure over the first portion of the dielectric region, where forming the polarizing mask structure over the first portion of the dielectric region includes vertically aligning the polarizing mask structure and the first photodiode. The series of one or more semiconductor processing operations includes forming a second portion of the dielectric region over the first portion of the dielectric region and over the polarizing mask structure. The series of one or more semiconductor processing operations includes joining the dielectric region and a portion of a device including a second photodiode, where joining the dielectric region and the portion of the device including the second photodiode includes vertically aligning the second photodiode and the polarizing mask structure.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

FIG. 2 is a diagram of an example pixel array 200 (or a portion thereof) described herein. The pixel array 200 may be included in an image sensor, such as a complementary metal oxide semiconductor (CMOS) image sensor, a back side illuminated (BSI) CMOS image sensor, or another type of image sensor.

FIG. 2 shows a top-down view of the pixel array 200. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal.

As described in greater detail in connection with FIGS. 3-6 and elsewhere herein, the pixel sensors 202 may include a combination of light wave filters (e.g., light wave filters to filter targeted wavelengths of light) and polarizing structures (e.g., polarizing structures to polarize the targeted wavelengths of light). For example, and using the combination of light wave filters and polarizing structures, the pixel sensor 202*a* may include photodiodes that sense unpolarized red VIS light waves and polarized red VIS light waves (e.g., unpolarized and polarized electromagnetic waves having wavelengths that are included in a range of approximately 620 nanometers to approximately 750 nanometers). Additionally, or alternatively, the pixel sensor 202*b* may include photodiodes that sense unpolarized blue VIS light waves and polarized blue VIS light waves (e.g., unpolarized and polarized electromagnetic waves having wavelengths that are included in a range of approximately 450 nanometers to approximately 495 nanometers). Additionally, or alternatively, the pixel sensor 202*c* may include photodiodes that sense unpolarized green VIS light waves and polarized green VIS light waves (e.g., unpolarized and polarized electromagnetic waves having wavelengths that are included in a range of approximately 495 nanometers to approximately 570 nanometers). Additionally, or alternatively, the pixel sensor 202*d* may include photodiodes that sense unpolarized NIR light waves and polarized NIR light waves (e.g., unpolarized and polarized electromagnetic waves having wavelengths that are included in a range of approximately 750 nanometers to approximately 2500 nanometers).

As indicated above, FIG. 2 is provided as an example. Other examples may differ from what is described with regard to FIG. 2.

Figure 3:
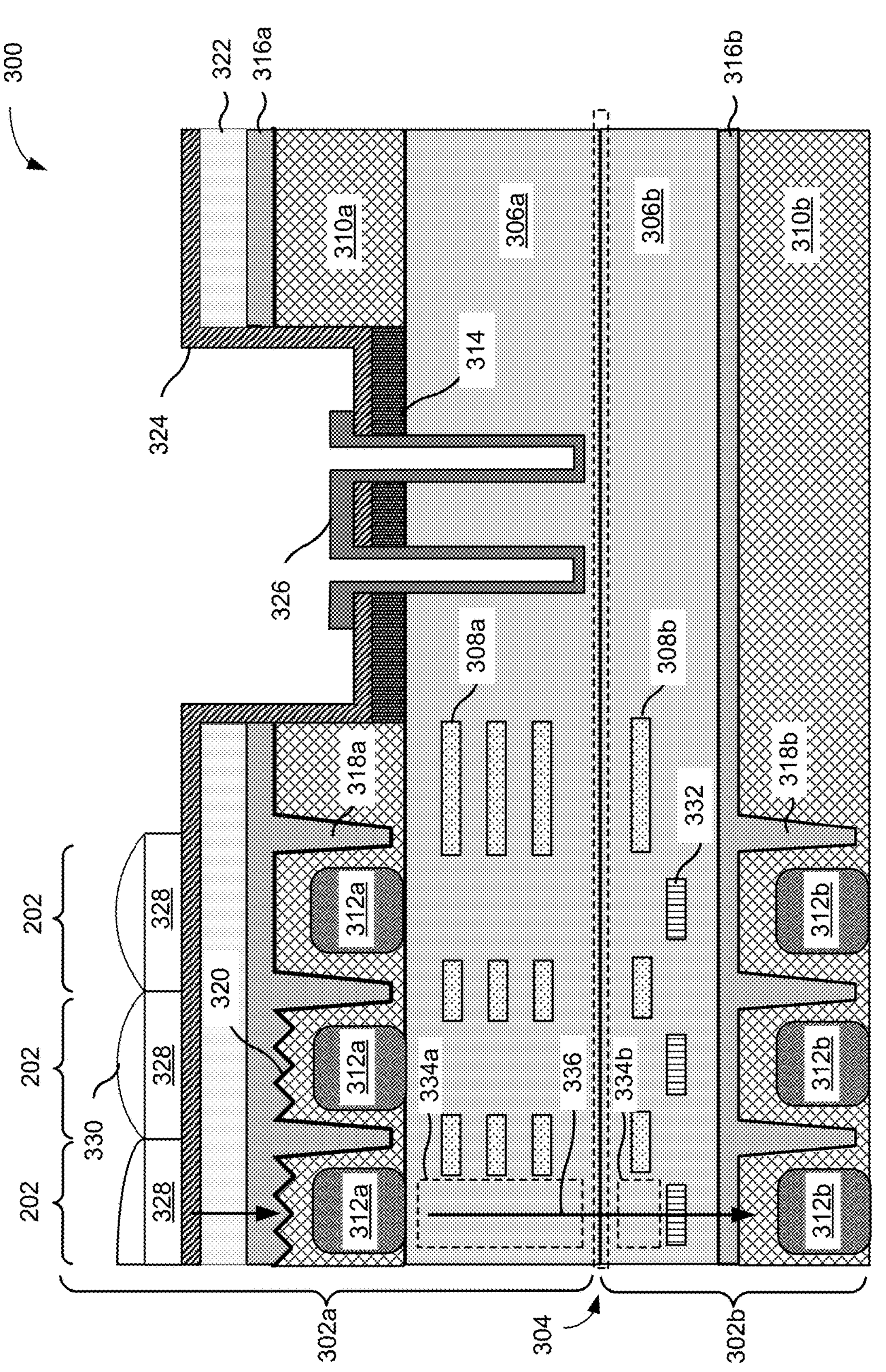
FIG. 3 is a diagram of an example optoelectronic device including a polarizing mask structure described herein.

FIG. 3 is a diagram of an example optoelectronic device 300 described herein. As shown in FIG. 3, the optoelectronic device 300 includes a combination of optoelectronic devices 302*a* and 302*b* that are joined by a bonding interface 304. In some implementations, the optoelectronic device 300 may correspond to a three dimensional complementary metal oxide semiconductor image sensor (3D CIS) device, in which the optoelectronic devices 302*a* and 302*b* are stacked and/or vertically arranged.

As further shown in FIG. 3, the device 302*a* may include a dielectric region 306*a*. In some implementations, the dielectric region 306*a* corresponds to a first dielectric region of the optoelectronic device 300. The dielectric region 306*a* (e.g., an intermetal dielectric region) may include one or more layers of dielectric material (e.g., a silicon oxide ($SiO_x$), a silicon nitride ($Si_xN_y$), a silicon oxynitride (SiON), tetraethyl orthosilicate oxide, phosphosilicate glass (PSG), borophosphosilicate glass (BPSG), fluorinated silica glass (FSG), carbon doped silicon oxide, or another dielectric material). One or more metallization layers 308*a* may be formed in and/or in between the layers of the dielectric region 306*a*. The metallization layers 308*a* may include bonding pads, conductive lines, and/or other types of conductive structures that electrically connect the various regions of the device 302*a* and/or electrically connect the various regions of the optoelectronic device 300 to one or more external devices and/or external packaging. In some implementations, the metallization layers 308*a* may be referred to as a BEOL metallization stack, and may include a conductive material, such as gold, copper, silver, cobalt, tungsten, a metal alloy, or a combination thereof, among other examples.

The device 302*a* may further include a layer of a semiconductor material 310*a*. In some implementations, the layer of the semiconductor material 310*a* corresponds to a first device region of the optoelectronic device 300. The layer of the semiconductor material 310*a* may include a semiconductor material such as silicon, a III-V compound such as gallium arsenide (GaAs), a silicon on insulator (SOI) layer, or another type of layer of a semiconductor material that is capable of generating a charge from photons of incident light.

Photodiode(s) 312*a* for sensing light (e.g., light waves) may be included within the layer of the semiconductor material 310*a*. The photodiode(s) 312*a* may include a plurality of types of ions to form a p-n junction or a p-i-n junction (e.g., a junction between a p-type portion, an intrinsic (or undoped) type portion, and an n-type portion). For example, the layer of the semiconductor material 310*a* may be doped with an n-type dopant to form a first portion (e.g., an n-type portion) of the photodiode(s) 312*a* and a p-type dopant to form a second portion (e.g., a p-type portion) of the photodiode(s) 312*a*. The photodiode(s) 312*a* may include visible light photodiodes and/or near infrared light photodiodes.

Further, and in some implementations of the device 302*a*, a shallow trench isolation (STI) region 314 may be the above the dielectric region 306*a*. The STI region 314 may electrically isolate the photodiode(s) 312*a* from other regions of the device 302*a*.

As shown in FIG. 3, an oxide layer 316*a* may be located above the layer of the semiconductor material 310*a*. The oxide layer 316*a* may function as a passivation layer between the layer of the semiconductor material 310*a* and the upper layers of the pixel sensors 202. In some implementations, the oxide layer 316*a* includes an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another dielectric material is used in place of the oxide layer 316*a* as a passivation layer.

The oxide layer 316*a* may fill deep trench isolation (DTI) structures 318*a* included in the layer of the semiconductor material 310*a*. In particular, DTI structures 318*a* may be formed between each of the photodiode(s) 312*a*. The DTI structures 318*a* may include trenches (e.g., deep trenches) that extend downward into the layer of the semiconductor material 310*a* between the photodiode(s) 312*a*. The DTI structures 318*a* may provide optical isolation between the photodiode(s) 312*a* to reduce the amount of optical crosstalk between adjacent photodiodes.

One or more high absorption (HA) regions 320 may be located above one or more photodiode(s) 312*a*. Each HA region 320 may be defined by a shallow trench. A plurality of adjacent HA regions 320 may form a periodic or zig-zag structure in the layer of the semiconductor material 310*a* and/or the photodiode(s) 312*a*. The one or more HA regions 320 may be formed in a same side of the layer of the semiconductor material 310*a* as the DTI structures 318*a*.

The HA region 320 may increase the absorption of incident light for a photodiode(s) 312*a* (thereby increasing the quantum efficiency of the photodiode(s) 312*a*) by modifying or changing the orientation of the refractive interface between the photodiodes and the layer of the semiconductor material 310*a*. The angled walls of the HA region 320 changes the orientation of the interface between the photodiode(s) 312*a* and the layer of the semiconductor material 310*a* by causing the interface to be diagonal relative to the orientation of a top surface of the layer of the semiconductor material 310*a*. This change in orientation may result in a smaller angle of refraction relative to a flat surface of the top surface of the layer of the semiconductor material 310*a* for the same angle of incidence of incident light. As a result, the HA region 320 is capable of directing wider angles of incident light toward the center of the photodiode(s) 312*a* than if no HA region 320 were included in the optoelectronic device 300.

In some implementations, a top surface of the layer of the semiconductor material 310*a*, the surfaces of the DTI structures 318*a*, and the surfaces of the HA region 320 may be coated with an antireflective coating (ARC) layer to decrease reflection of incident light away from the photodiode(s) 312*a* to increase transmission of incident light into the layer of the semiconductor material 310*a* and the photodiode(s) 312*a*.

As further shown in FIG. 3, one or more passivation layers may be formed above and/or oxide layer 316*a*. For example, a backside illumination (BSI) oxide layer 322 may be located above and/or on portions of the oxide layer 316*a*. As another example, a buffer oxide layer 324 may be located above and/or on the BSI oxide layer 322. In some implementations, the BSI oxide layer 322 and/or the buffer oxide layer 324 include an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another dielectric material is used in place of the BSI oxide layer 322 and/or the buffer oxide layer 324 as a passivation layer.

A bonding pad 326 may be located above the STI region 314, and/or above and/or on the buffer oxide layer 324. The bonding pad 326 may extend through the buffer oxide layer 324, through the STI region 314, and to the dielectric region 306*a*, and may contact one or more metallization layers 308*a* in the dielectric region 306*a*. The bonding pad 326 may include a conductive material, such as gold, silver, aluminum, copper, aluminum-copper, titanium, tantalum, titanium nitride, tantalum nitride, tungsten, a metal alloy, other metals, or a combination thereof. The bonding pad 326 may provide electrical connections between the metallization layers 308*a* of the optoelectronic device 300 and external devices and/or external packaging.

The filter layer 328 (e.g., a light wave filter structure including portions of a color filter array and/or a near infrared filter array) is included above and/or on the buffer oxide layer 324 for one or more pixel sensors 202. The filter layer 328 may include one or more visible light color filter regions configured to filter particular wavelengths or wavelength ranges of visible light (e.g., that permit particular wavelengths or wavelength ranges of visible light to pass through the filter layer 328), one or more near infrared (NIR) filter regions (e.g., NIR bandpass filter regions) configured to permit wavelengths associated with NIR light to pass through the filter layer 328 and to block other wavelengths of light, one or more NIR cut filter regions configured to block NIR light from passing through the filter layer 328, and/or other types of filter regions.

In some implementations, the one or more pixel sensors 202 are each configured with a filter region of the filter layer 328. In some implementations, a micro-lens layer 330 is included above and/or on the filter layer 328. The micro-lens layer 330 may include a plurality of micro-lenses. In particular, the micro-lens layer 330 may include a respective micro-lens for pixel sensors in a pixel sensor array (e.g., each of the pixel sensors 202 included in the pixel array 200).

As shown in FIG. 3, the device 302*b* includes a dielectric region 306*b*. In some implementations, the dielectric region 306*b* corresponds to a second dielectric region of the optoelectronic device 300. The dielectric region 306*b* (e.g., an intermetal dielectric region) may include one or more layers of dielectric material (e.g., a silicon oxide ($SiO_x$), a silicon nitride ($Si_xN_y$), a silicon oxynitride (SiON), tetraethyl orthosilicate oxide, phosphosilicate glass (PSG), borophosphosilicate glass (BPSG), fluorinated silica glass (FSG), carbon doped silicon oxide, or another dielectric material). Metallization layers 308*b* may be formed in and/or in between the layers of the dielectric region 306*b*. The metallization layers 308*b* may include bonding pads, conductive lines, and/or other types of conductive structures that electrically connect the various regions of the device 302*b* and/or electrically connect the various regions of the optoelectronic device 300 with one or more external devices and/or external packaging. The metallization layers 308*a* may be referred to as a BEOL metallization stack, and may include a conductive material, such as gold, copper, silver, cobalt, tungsten, a metal alloy, or a combination thereof, among other examples.

The device 302*b* may further include a layer of a semiconductor material 310*b* (e.g., a second device region including the layer of the semiconductor material 310*b*). The layer of the semiconductor material 310*b* may include a semiconductor material such as silicon, a III-V compound such as gallium arsenide (GaAs), a silicon on insulator (SOI) layer, or another type of layer of a semiconductor material that is capable of generating a charge from photons of incident light.

In some implementations, the layer of the semiconductor material 310*a* and the layer of semiconductor material 310*b* include a same material. Alternatively, and in some implementations, the layer of the semiconductor material 310*b* includes a material that is different than a material included the layer of the semiconductor material 310*a*. For example, the layer of the semiconductor material 310*b* may include a material having a "narrow" bandgap that is suitable for detecting NIR light waves (e.g., a material having a band gap that is included in a range of approximately 0.6 electron volts (eV) to approximately 1.7 eV, such as indium gallium arsenide (InGaAs), lead sulfide (PbS), or lead selenide (PbSe)), while the layer of the semiconductor material 310*a* includes a material having a wider bandgap that is suitable for detecting VIS light waves (e.g., a material having a band gap that is included in a range of approximately 1.1 eV electron volts (eV) to approximately 1.4 eV, such as silicon (Si) or gallium arsenide (GaAs)).

Photodiode(s) 312*b* for sensing light (e.g., light waves) may be included within the layer of the semiconductor material 310*b*. The photodiode(s) 312*b* may include a plurality of types of ions to form a p-n junction or a p-i-n junction (e.g., a junction between a p-type portion, an intrinsic (or undoped) type portion, and an n-type portion). For example, the layer of the semiconductor material 310*b* may be doped with an n-type dopant to form a first portion (e.g., an n-type portion) of the photodiode(s) 312*b* and a p-type dopant to form a second portion (e.g., a p-type portion) of the photodiode(s) 312*b*. Furthermore, the photodiode(s) 312*b* may include visible light photodiodes and/or near infrared light photodiodes.

In some implementations, dopants in the included in the photodiode(s) 312*a* and 312*b* are a same dopant. Alternatively, and in implementations, dopants included in one or more of the photodiode(s) 312*b* are different than dopants included in one or more of the photodiode(s) 312*a*. For example, the photodiode(s) 312*b* may include dopants suitable for detecting NIR light waves (e.g., silicon (Si) or tellurium (Te)), while one or more of the photodiode(s) 312*a* include dopants suitable for detecting VIS light waves (e.g., boron (B), aluminum (Al), phosphorus (P), or arsenic (As)).

As shown in FIG. 3, an oxide layer 316*b* may be located above the layer of the semiconductor material 310*b*. The oxide layer 316*b* may function as a passivation layer between the layer of the semiconductor material 310*b* and the upper layers of the pixel sensors 202. In some implementations, the oxide layer 316*b* includes an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another dielectric material is used in place of the oxide layer 316*b* as a passivation layer.

The oxide layer 316*b* may fill deep trench isolation (DTI) structures 318*b* included in the layer of the semiconductor material 310*b*. In particular, DTI structures 318*b* may be formed between each of the photodiode(s) 312*b*. The DTI structures 318*b* may include trenches (e.g., deep trenches) that extend downward into the layer of the semiconductor material 310*b* between the photodiode(s) 312*b*. The DTI structures 318*b* may provide optical isolation between the photodiode(s) 312*b* to reduce the amount of optical crosstalk between adjacent photodiodes.

As shown in FIG. 3, and as described in greater detail in connection with FIGS. 4A-4D and elsewhere herein, one or more polarization mask structure(s) 332 may be included in the dielectric region 306*b* between one or more respective pairs of the photodiode(s) 312*a* and 312*b*. Furthermore, and as shown in FIG. 3, the dielectric regions 306*a* and 306*b* include pass-through regions 334*a* and 334*b* that allow light waves 336 (which may be filtered by the filter layer 328) to pass from the photodiode(s) 312*a*, between the metallization layers 308*a* and 308*b*, and to the polarization mask structure(s) 332. The light waves 336 may be polarized by the polarization mask structure(s) 332 prior to being sensed by the photodiode(s) 312*b*.

Based on arrangements and/or configurations of the filter layer 328, the photodiode(s) 312*a*, the polarizing mask structure(s) 332, and the photodiode(s) 312*b*, the optoelectronic device 300 may simultaneously capture reflected light waves including a combination of unpolarized VIS light waves, polarized VIS light waves, unpolarized NIR light waves, and/or polarized NIR light waves. As such, an image processing system including the optoelectronic device 300 may multiplex the simultaneously captured unpolarized VIS light waves, polarized VIS light waves, unpolarized NIR light waves, and/or polarized NIR light waves to more accurately render an image of the target relative to another image processing system limited to multiplexing unpolarized VIS light waves and unpolarized NIR light waves that are captured by separate and discrete devices. This improved performance results in a reduction of an amount of computing resources needed by the image processing system. Additionally, and by combining unpolarized VIS light detection capabilities, polarized VIS light detection capabilities, unpolarized NIR light detection capabilities, and polarized NIR light detection capabilities in the optoelectronic device 300, an amount of semiconductor manufacturing resources needed to manufacture the image processing system is reduced (e.g., semiconductor manufacturing tools, raw materials, manpower, and/or computing resources).

As shown in FIG. 3, device (e.g., the optoelectronic device 300) include a light wave filter structure (e.g., the filter layer 328). The device includes a first photodiode in a first device region below the light wave filter structure (e.g., the photodiode(s) 312*a* in the layer of semiconductor material 310*a*). The device includes a second photodiode in a second device region below the first photodiode (e.g., the photodiode(s) 312*b* in the layer of semiconductor material 310*b*). The device includes a polarizing mask structure (e.g., the polarizing mask structure(s) 332) between the first photodiode and the second photodiode.

Additionally, or alternatively and in some implementations, the device (e.g., the optoelectronic device 300) includes a wave filter structure (e.g., the filter layer 328) having a transmissivity that allows red visible light waves and near infrared light waves to pass through the light wave filter structure. The device includes a red visible light photodiode in a first device region (e.g., the photodiode(s) 312*a* in the layer of semiconductor material 310*a*, where the photodiode(s) 312*a* include dopants suitable to detect red VIS light and the layer of semiconductor material 310*a* includes a material with a bandgap suitable to detect VIS light) below the light wave filter structure. The device includes a near infrared light photodiode in a second device region below the red visible light photodiode (e.g., the photodiode(s) 312*b* in the layer of semiconductor material 310*b*, where the photodiode(s) 312*b* include dopants suitable to detect NIR light and the layer of semiconductor material 310*b* includes a material with a bandgap suitable to detect NIR light). The device includes a polarizing mask structure (e.g., the polarizing mask structure(s) 332) between the red visible light photodiode and the near infrared light photodiode.

The number and arrangement of components, structures, and/or layers shown in the optoelectronic device 300 of FIG. 3 are provided as an example. In practice, the optoelectronic device 300 may include additional components, structures, and/or layers; fewer components, structures, and/or layers; different components, structures, and/or layers; and/or differently arranged components, structures, and/or layers than those shown in FIG. 3.

FIGS. 4A-4D are diagrams of an example implementation 400 of a polarizing mask structure described herein. The example implementation 400 includes details that may be related to the polarizing mask structure(s) 332 of FIG. 3 and elsewhere herein.

Figure 4A:
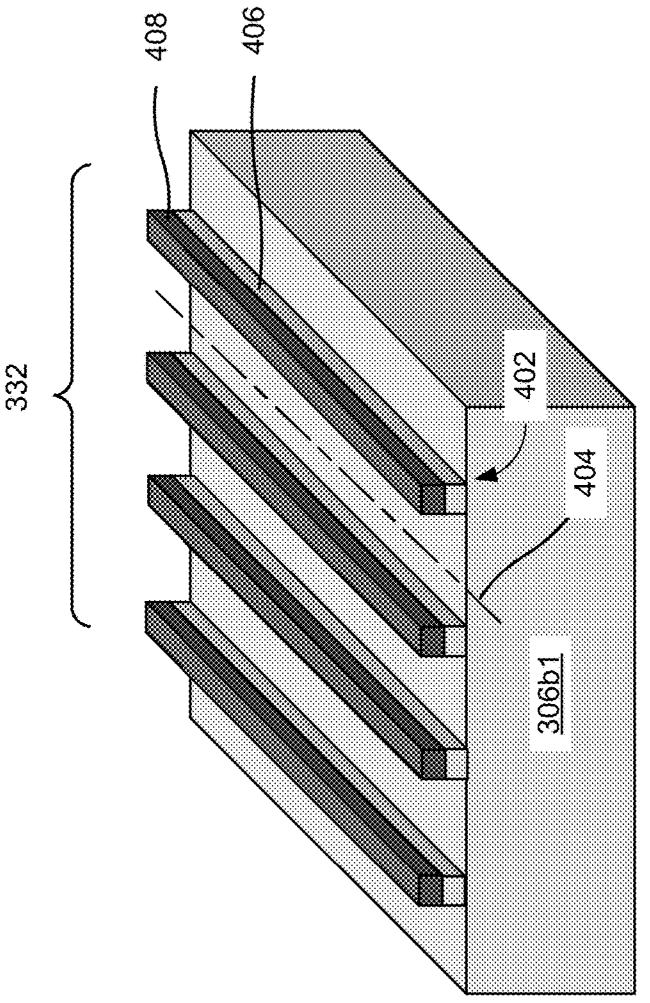
FIGS. 4A-4D are diagrams of an example implementation of a polarizing mask structure described herein.

As shown in FIG. 4A, the polarizing mask structure(s) 332 may be formed on a first portion of the dielectric region 306 (e.g., the portion 306*b*1). The polarizing mask structure(s) 332 includes polarizing beam structure(s) 402 that are dispersed along axes that are approximately parallel to a polarizing axis 404.

The polarizing beam structure(s) 402 includes a base layer 406 and a capping layer 408. The base layer 406 and the capping layer 408 may include materials that are reflective and/or non-transmissive to VIS light waves and/or NIR light waves. For example, the base layer 406 may include a titanium material (Ti). Additionally, or alternatively, the capping layer 408 may include a gold material (Au), a copper material (Cu), a nickel-cobalt material (NiCo), or a nickel-iron material (NiFe).

Figure 4B:
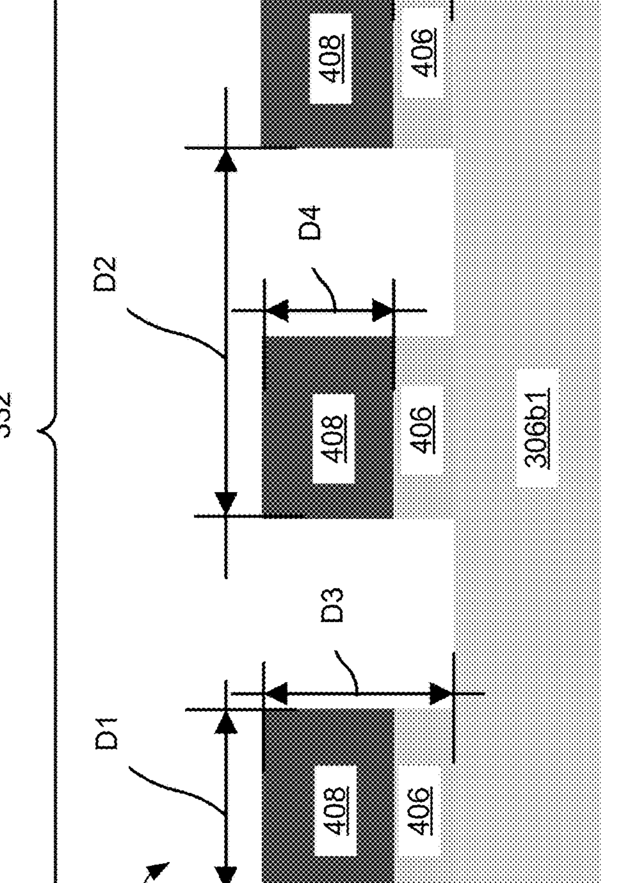

FIG. 4B shows example dimensions of the polarizing mask structure(s) 332. In some implementations, a width D1 of the polarizing beam structure(s) 402 may be included in a range of approximately 180 nanometers to approximately 220 nanometers. Additionally, or alternatively, a pitch D2 between the polarizing beam structure(s) 402 may be included in a range of approximately 360 nanometers to approximately 440 nanometers. If the width D1 is greater than approximately 220 nanometers, and the pitch D2 is less than approximately 360 nanometers, an amount of light (e.g., an amount of the light waves 336) passing through the polarizing mask structure(s) 332 may be insufficient for an underlying photodiode (e.g., the photodiode(s) 312*b*) to sense. If the width D1 is less than approximately 180 nanometers, and the pitch is greater than approximately 440 nanometers, an effectiveness of the polarizing mask structure(s) 332 may be reduced such that light detected by the underlying photodiode is indistinguishable from unpolarized light. However, other values and ranges for the width D1 and the pitch D2 are within the scope of the present disclosure.

Additionally, or alternatively, a height D3 of the polarizing beam structure(s) 402 may be included in a range of approximately 180 nanometers to approximately 220 nanometers. If the height D3 is greater than approximately 220 nanometers, shadowing, reflection, and/or distortion of light waves (e.g., the light waves 336) passing through the polarizing mask structure may occur. If the height is less than approximately 180 nanometers, an effectiveness of the polarizing mask structure(s) 332 may be reduced such that light detected by an underlying photodiode (e.g., the photodiode(s) 312*b*) is indistinguishable from unpolarized light. However, other values and ranges for the height D3 are within the scope of the present disclosure.

In some implementations, and as shown, a height D4 of the capping layer 408 may be included in range of approximately 185 nanometers to approximately 215 nanometers. Additionally, or alternatively, a height D5 of the base layer 406 may be included in a range of approximately 8 nanometers to approximately 12 nanometers. If the heights D4 and D5 fail to satisfy these ranges, the height D3 of the polarizing beam structure(s) 402 may not be included in the range of approximately 180 nanometers to approximately 220 nanometers. Additionally, or alternatively, if the heights D4 and D5 fail to satisfy these ranges, a cost of manufacturing the polarizing mask structure(s) 332 may increase. However, other values and ranges for the heights D4 and D5 are within the scope of the present disclosure.

Figure 4C:
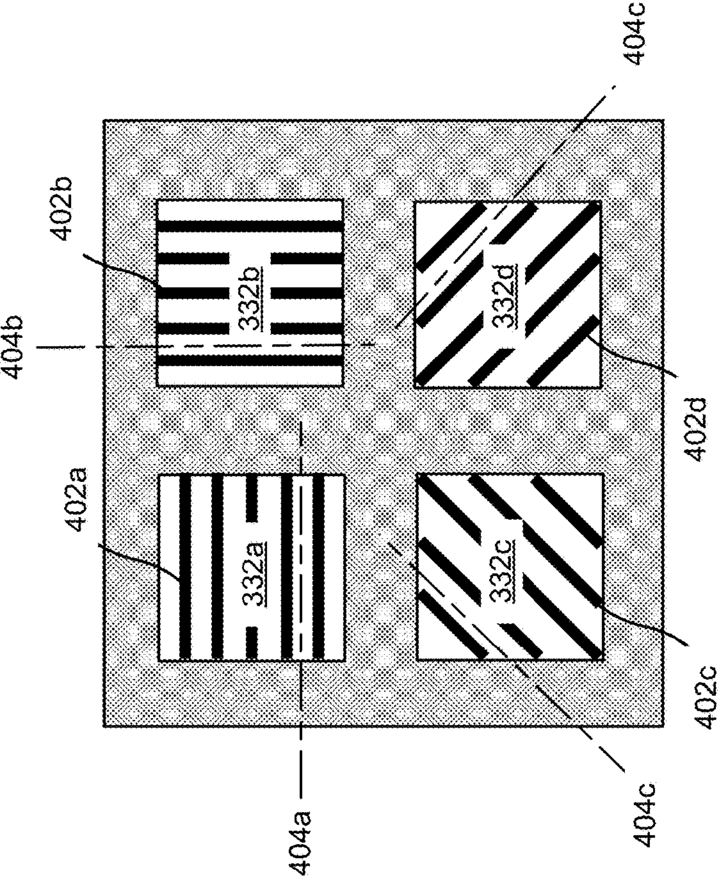

FIG. 4C shows example orientations of the polarizing mask structure(s) 332. As shown in FIG. 4C, the polarizing beam structure(s) 402*a* of polarizing mask structure(s) 332*a* are approximately parallel to the polarizing axis 404*a*. Additionally, or alternatively and as shown in FIG. 4C, the polarizing beam structure(s) 402*b* of the polarizing mask structure(s) 332*b* may be approximately parallel to the polarizing axis 404*b*, where the polarizing axis 404*b* is approximately orthogonal relative to the polarizing axis 404*a*. Additionally, or alternatively and as shown in FIG. 4C, the polarizing beam structure(s) 402*c* of the polarizing mask structure(s) 332*c* may be approximately parallel to the polarizing axis 404*c*, where the polarizing axis 404*c* is at an angle of approximately +45 degrees) (° relative to the polarizing axis 404*a*. Additionally, or alternatively and as shown in FIG. 4C, the polarizing beam structure(s) 402*d* of the polarizing mask structure(s) 332 may be approximately parallel to the polarizing axis 404*d*, where the polarizing axis 404D is at an angle of approximately −45° relative to the polarizing axis 404*a*.

Figure 4D:
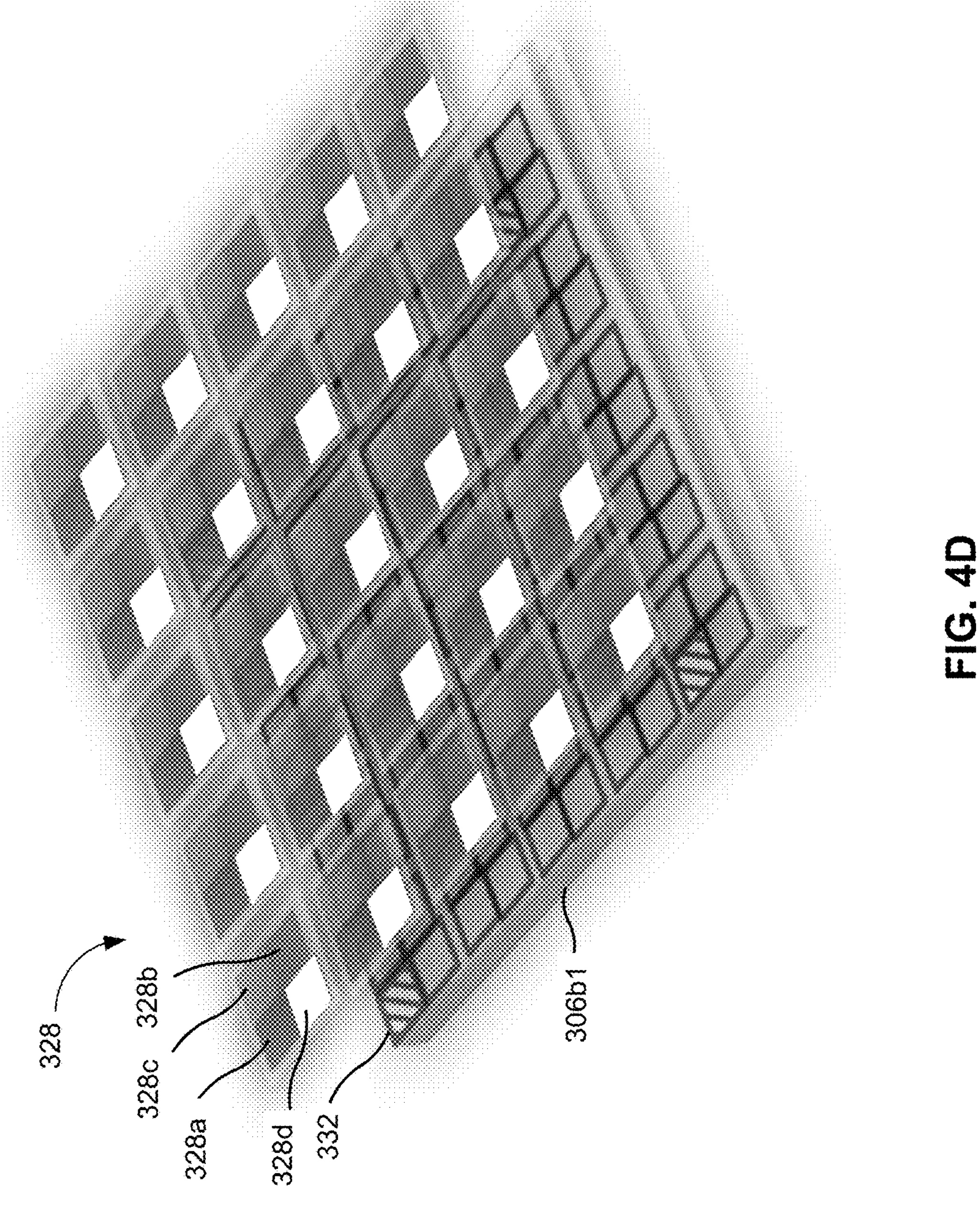

FIG. 4D shows an isometric, exploded view including the filter layer 328 relative to the polarizing mask structure(s) 332 and the first portion of the dielectric region 306 (e.g., the portion 306*b*1). In some implementations, and as shown in FIG. 4D, the filter layer 328 may include the portion 328*a* that is transmissive to red VIS light waves (e.g., blocks electromagnetic waves having wavelengths that are less than approximately 620 nanometers or greater than approximately 750 nanometers), the portion 328*b* that is transmissive to blue VIS light waves (e.g., blocks electromagnetic waves having wavelengths that are less approximately 450 nanometers or greater approximately 495 nanometers), the portion 328*c* that is transmissive to green VIS light waves (e.g., blocks electromagnetic waves having wavelengths that are less than approximately 495 nanometers or greater than approximately 570 nanometers), and the portion 328*d* that is transmissive to NIR light waves (e.g., blocks electromagnetic waves having wavelengths that are less than approximately 750 nanometers or greater than approximately 2500 nanometers).

For space saving purposes, and in some implementations, a "hybrid" portion may be included in the filter layer 328. As an example, the hybrid portion may be transmissive to overlapping spectrums (e.g., ranges of wavelengths) related to red VIS light and/or sub-spectrums of NIR light, obviating a need for discrete and separate portion of the filter layer 328 (e.g., the portions 328*a* and 328*d*) and underlying photodiodes. For the example, the hybrid portion may block electromagnetic waves having wavelengths of less than approximately 600 nanometers and greater than approximately 1000 nanometers. If the hybrid portion is transmissive to electromagnetic waves having wavelengths that are less than approximately 600 nanometers, green VIS light and/or blue VIS light may lead to an inaccurate sensing of red VIS light by an underlying photodiode configured to sense red the VIS light (e.g., an underlying photodiode, such as one or more of the photodiode(s) 312*a*, including materials and dopants selected to sense the red VIS light). If the hybrid portion is transmissive to electromagnetic waves having wavelengths that are greater than approximately 1000 nanometers, mid-wavelength near infrared (MW-NIR) light and/or long-wavelength near infrared (LW-NIR) light may lead to an inaccurate sensing of an underlying photodiode configured to sense short-wavelength near infrared (SW-NIR) light (e.g., an underlying photodiode, such as one or more of the photodiode(s) 312*b*, including materials and dopants selected to sense the SW-NIR light). However, other values and ranges for wavelengths of light waves blocked by such a hybrid portion are within the scope of the present disclosure.

In some implementations and based on an implementation of an optoelectronic device (e.g., the optoelectronic device 300), and/or an image processing system using information from the optoelectronic device, the polarizing mask structure(s) 332 may be associated with selected spectrums transmitted by respective portions of the filter layer 328 (e.g., associated with selected spectrums of VIS light and/or selected spectrums of NIR light). In such a case, the polarizing mask structure(s) 332 may be coaxially located with selected portions of the filter layer 328. Further, and in some implementations, approximate angular orientations of polarizing axes of the polarizing mask structure(s) 332 may be same approximate angular orientations regardless of selected, associated spectrum. Additionally, or alternatively, approximate angular orientations of the polarizing axes of the polarizing mask structure(s) 332 may be different approximate angular orientations based on a selected, associated spectrum.

The number and arrangement of components, structures, locations, and/or orientations of the polarizing mask structure(s) 332 of FIGS. 4A-4D are provided as examples. In practice, the polarizing mask structure(s) 332 may include additional components, structures, locations, and/or orientations; and/or differently arranged components, structures, locations and/or layers than those shown in FIGS. 4A-4D.

Figure 5A:
FIGS. 5A-5S are diagrams of an example implementation of forming the optoelectronic device of FIG. 3.
Figure 5A:
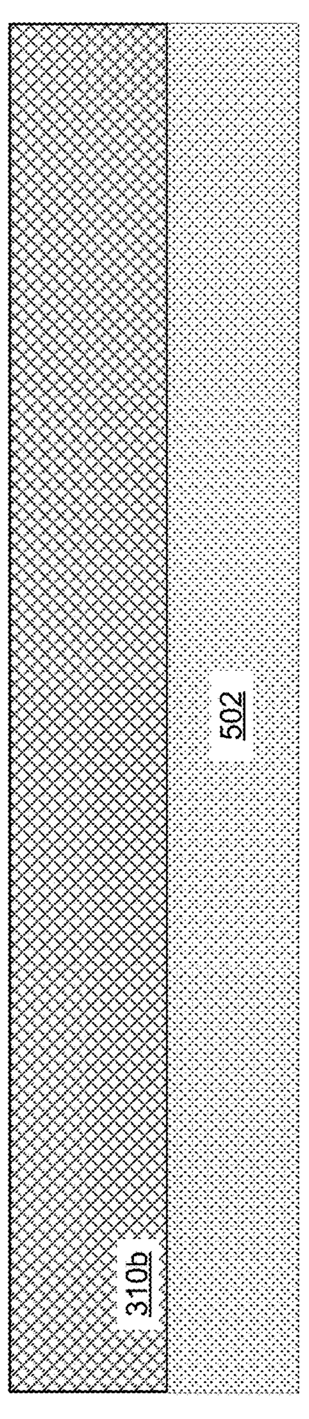
Figure 5B:
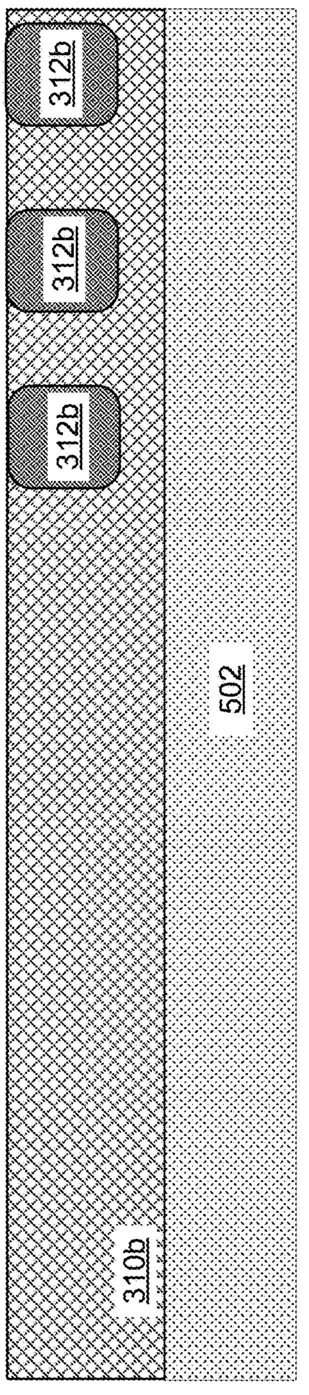
Figure 5C:
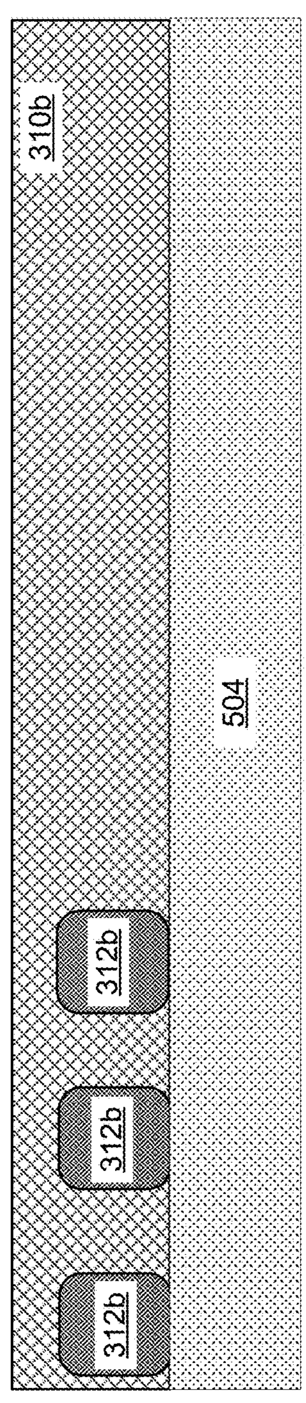
Figure 5D:
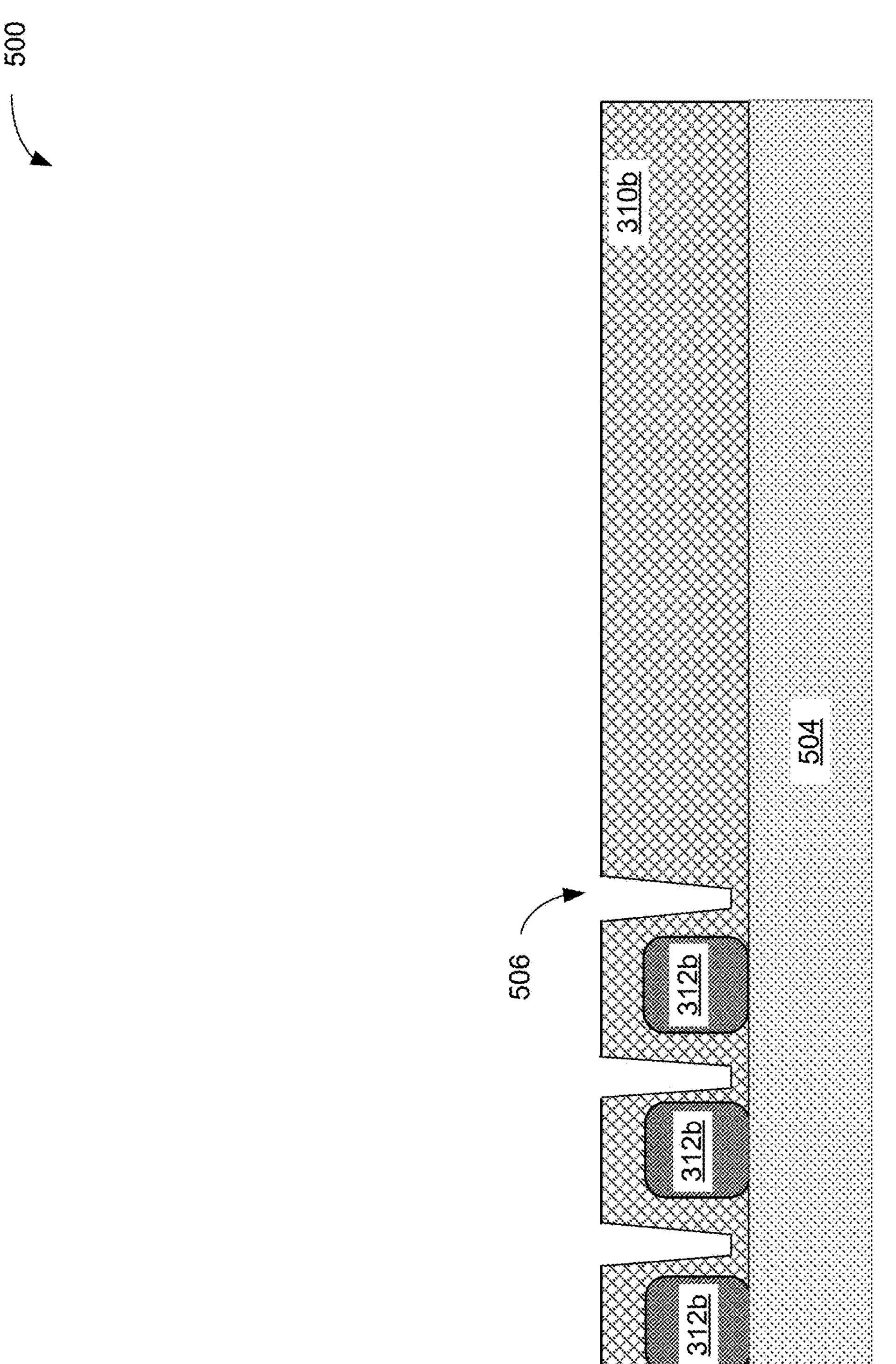
Figure 5E:
Figure 5E:
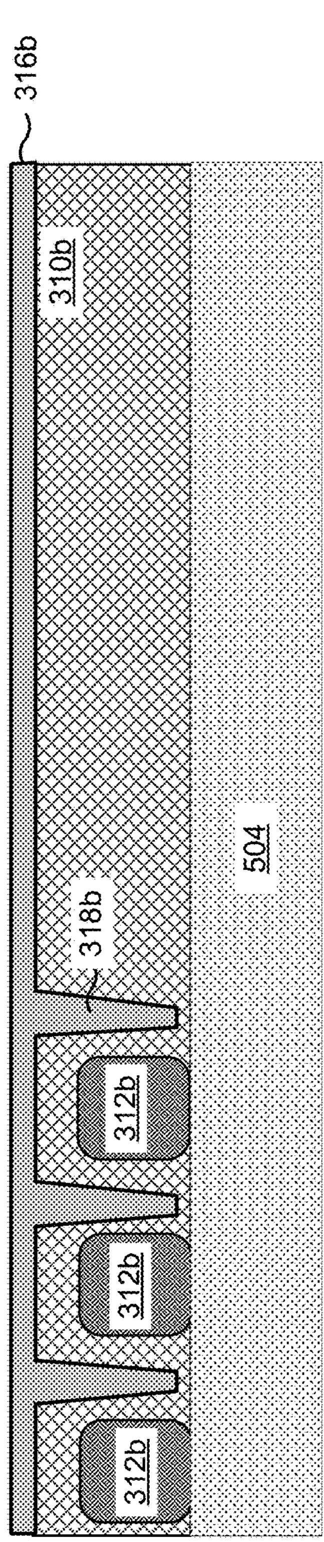
Figure 5F:
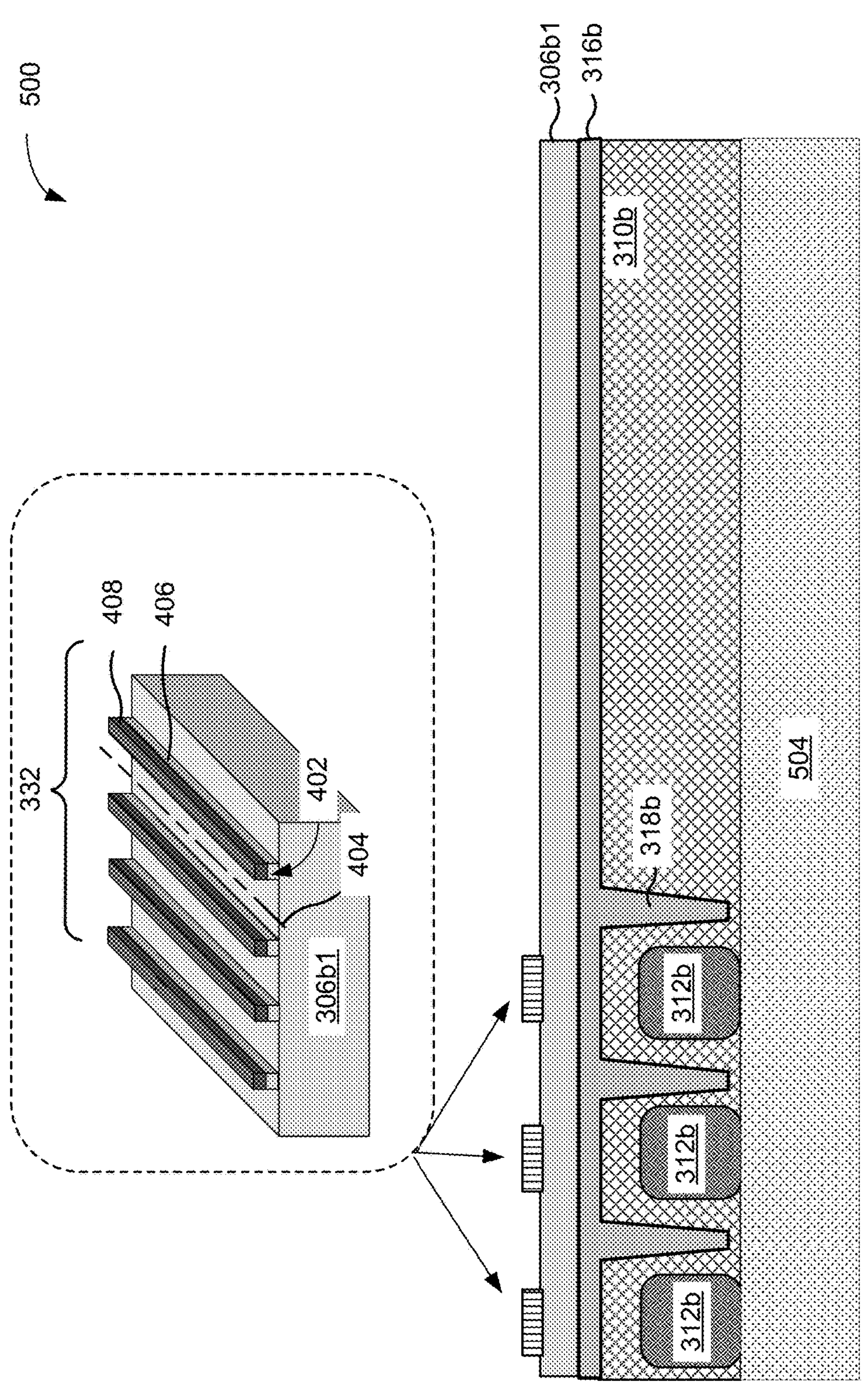
Figure 5G:
Figure 5G:
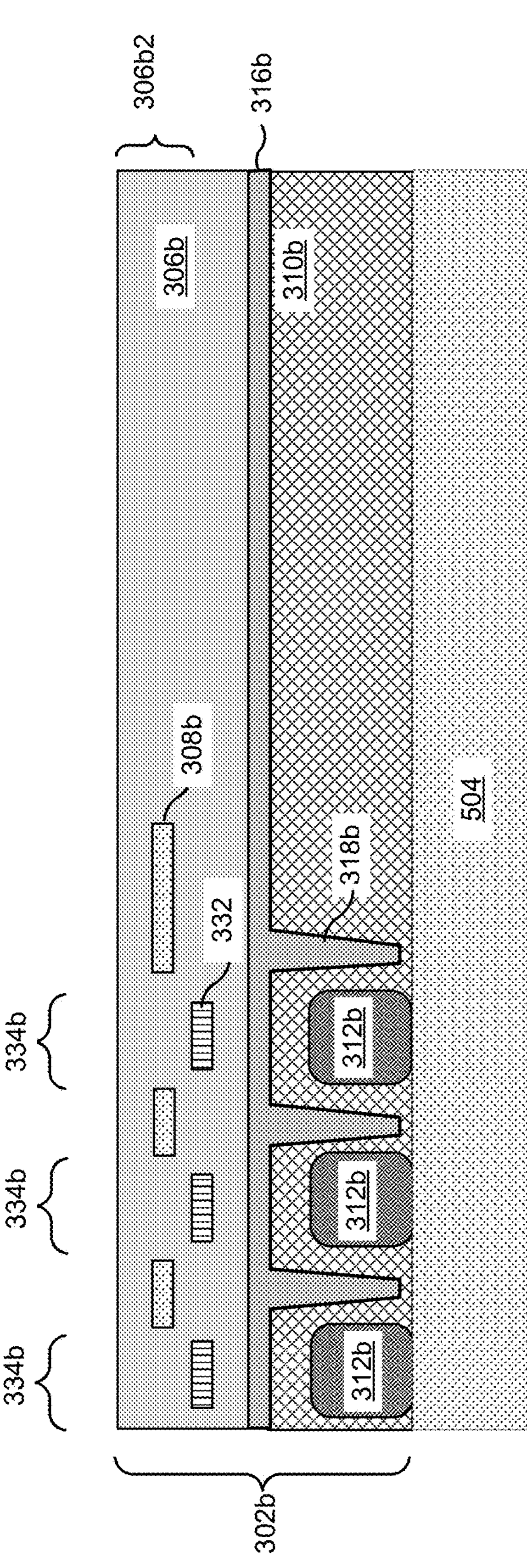
Figure 5H:
Figure 5H:
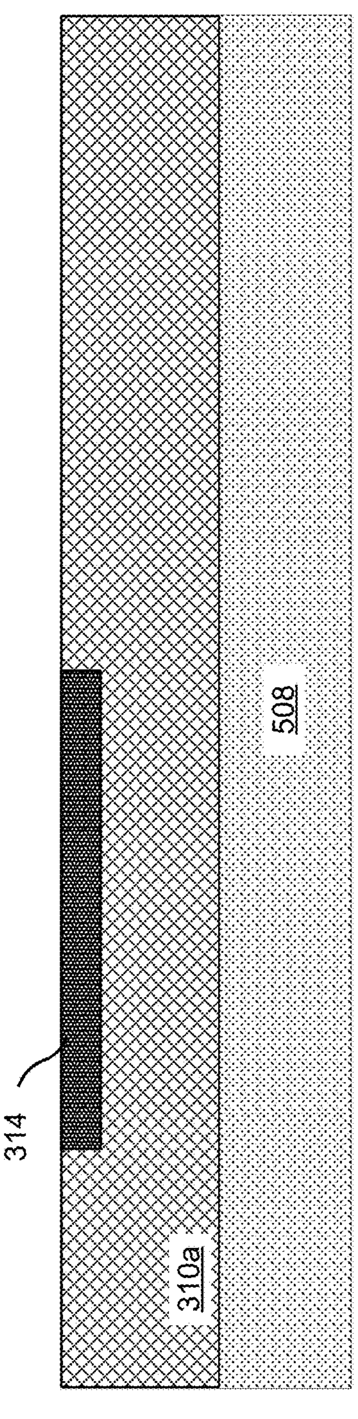
Figure 5I:
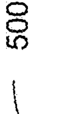
Figure 5I:
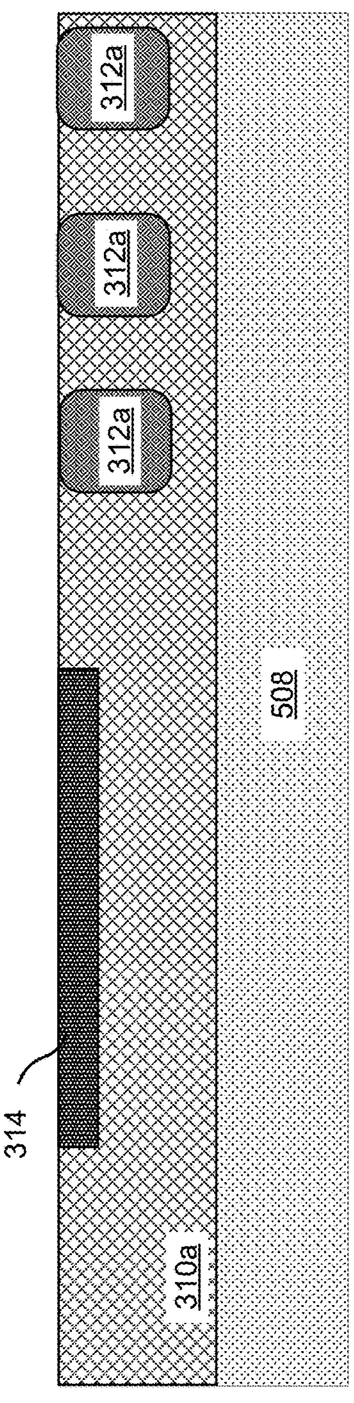
Figure 5J:
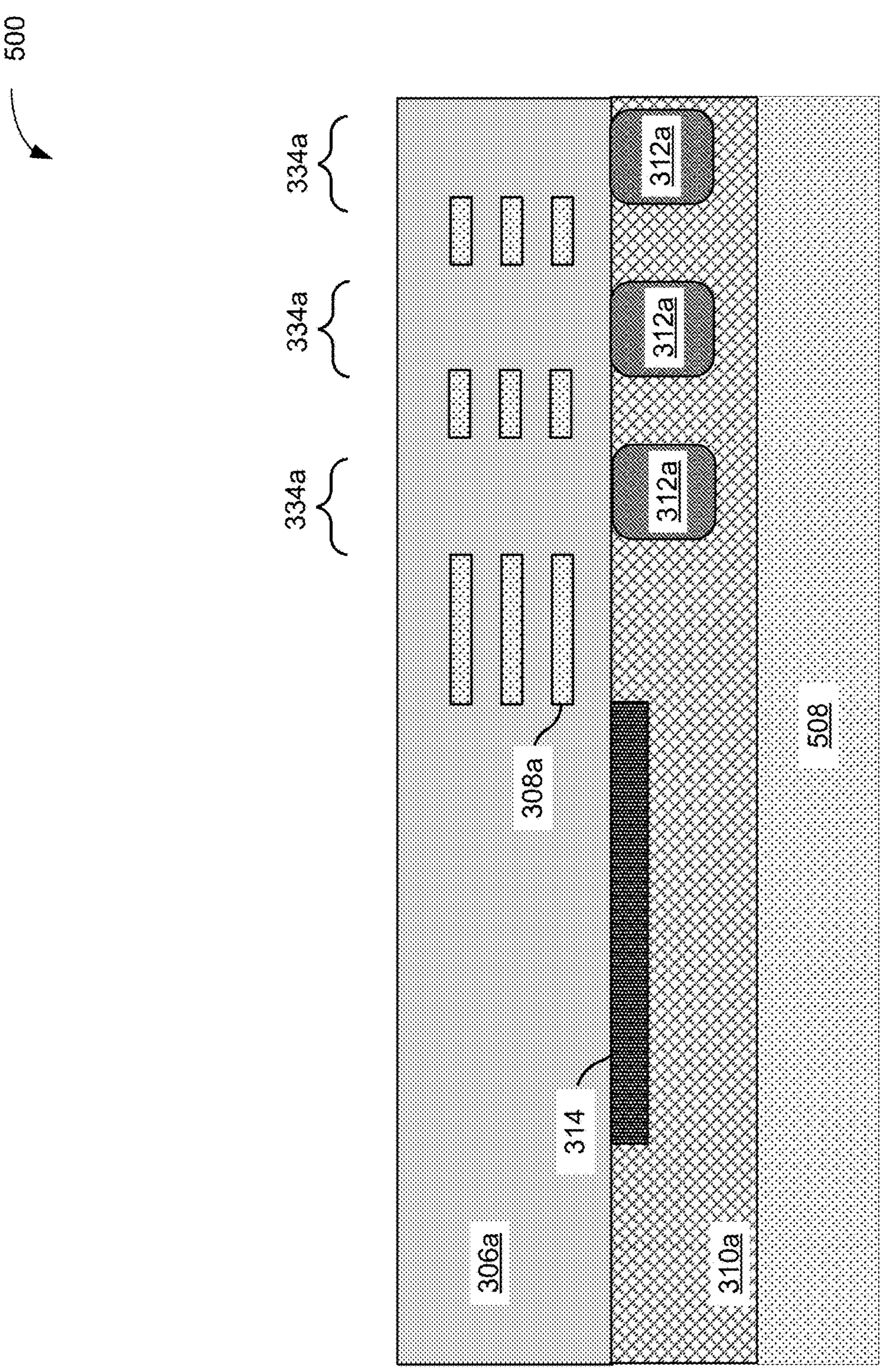
Figure 5K:
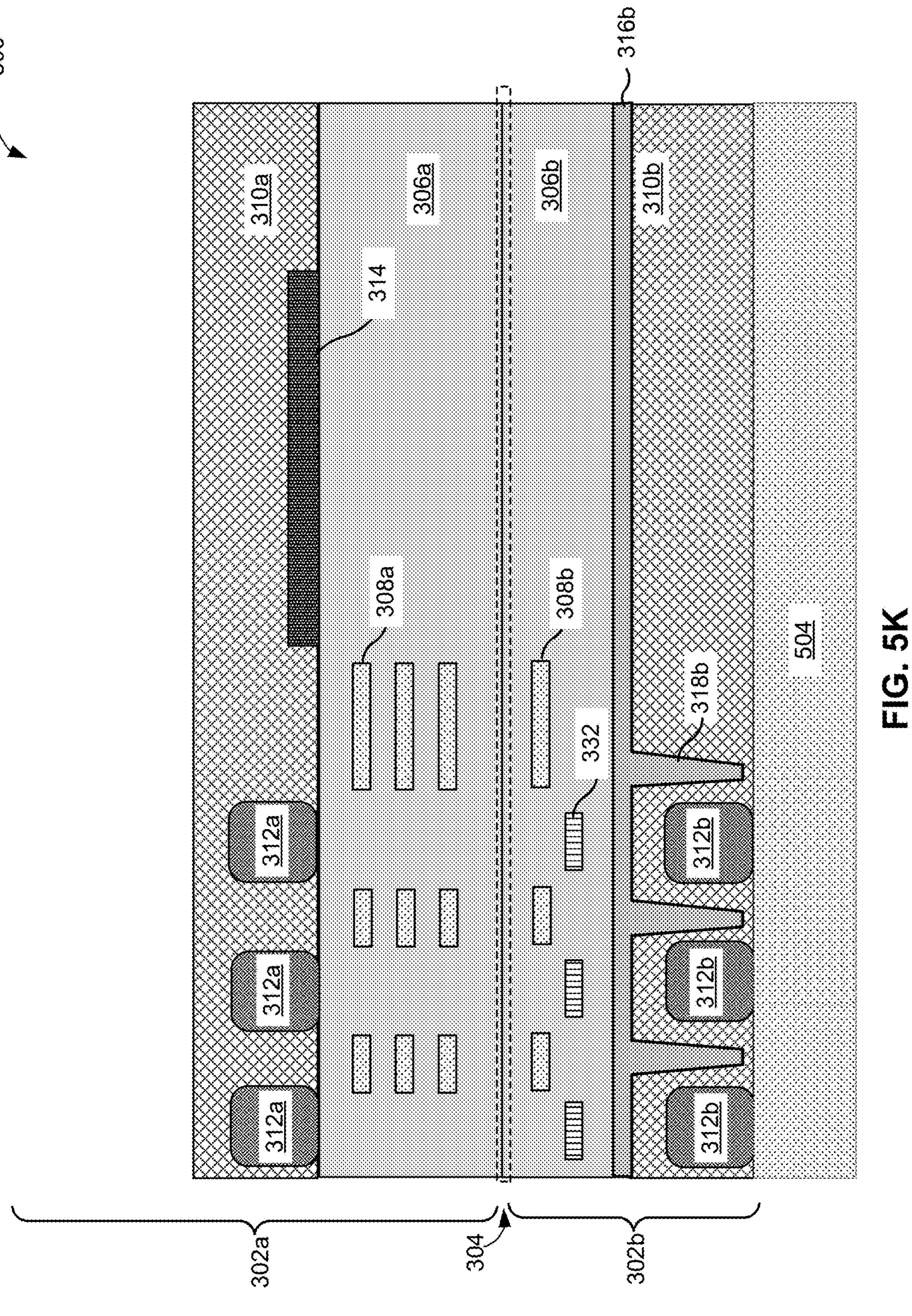
Figure 5L:
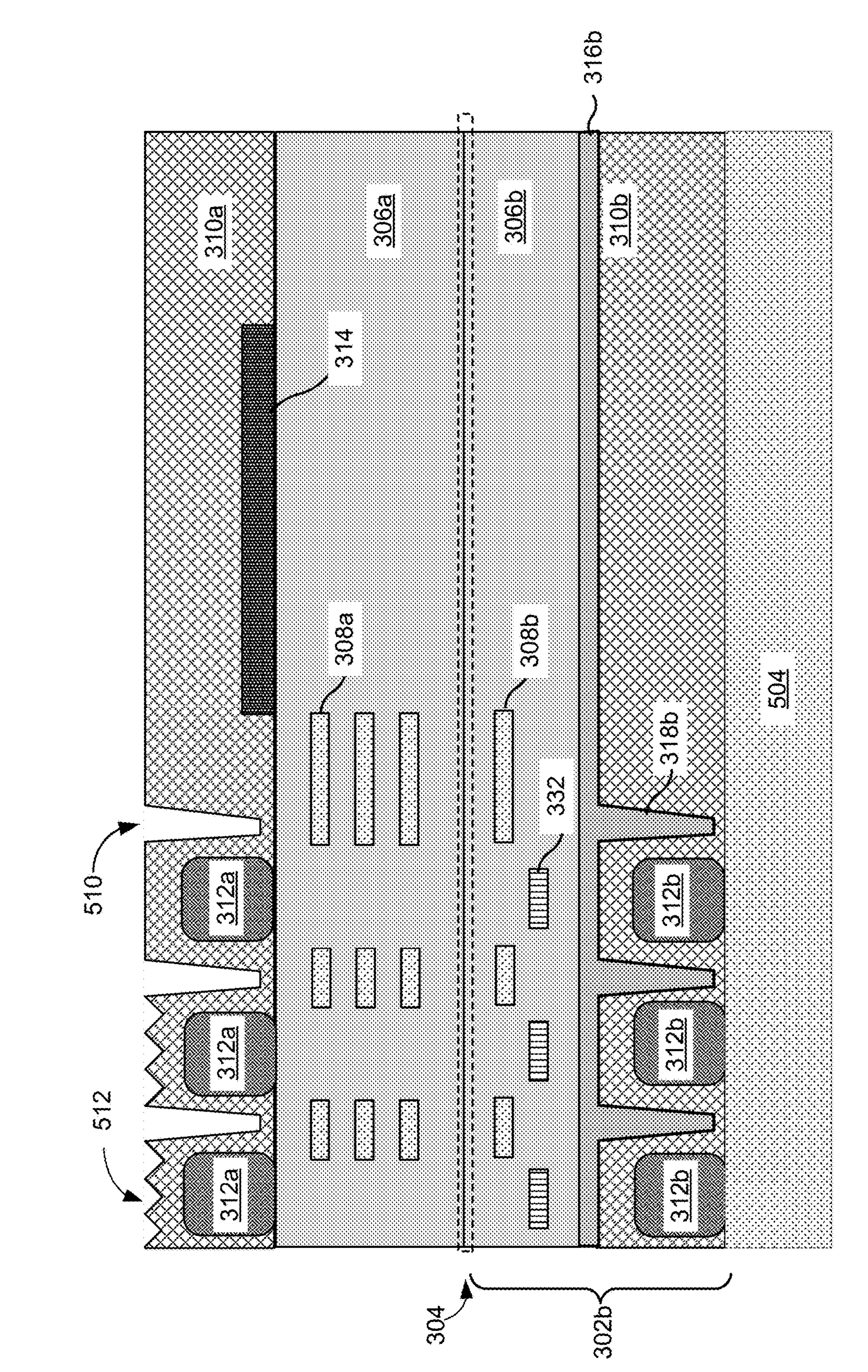
Figure 5M:
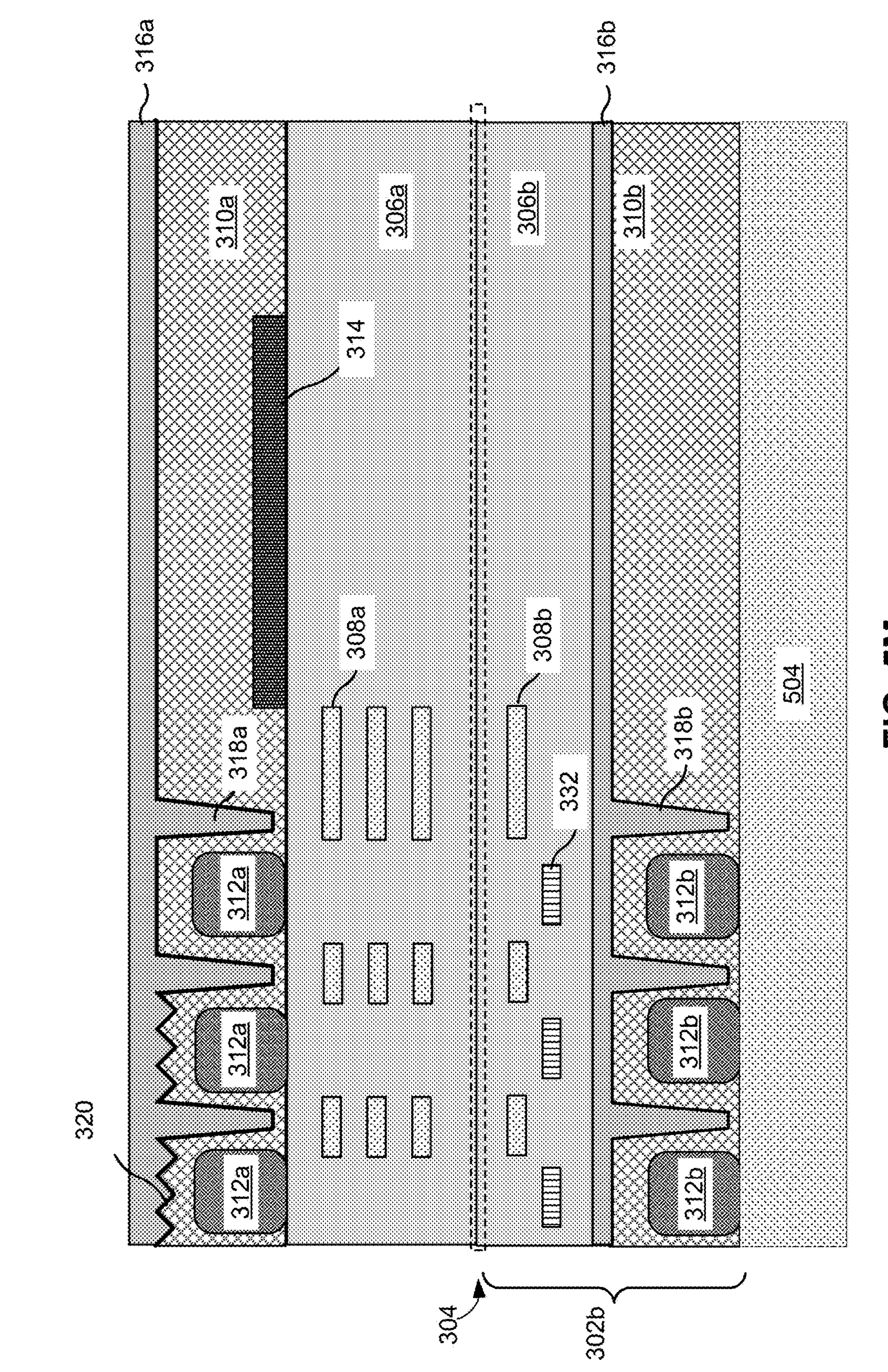
Figure 5N:
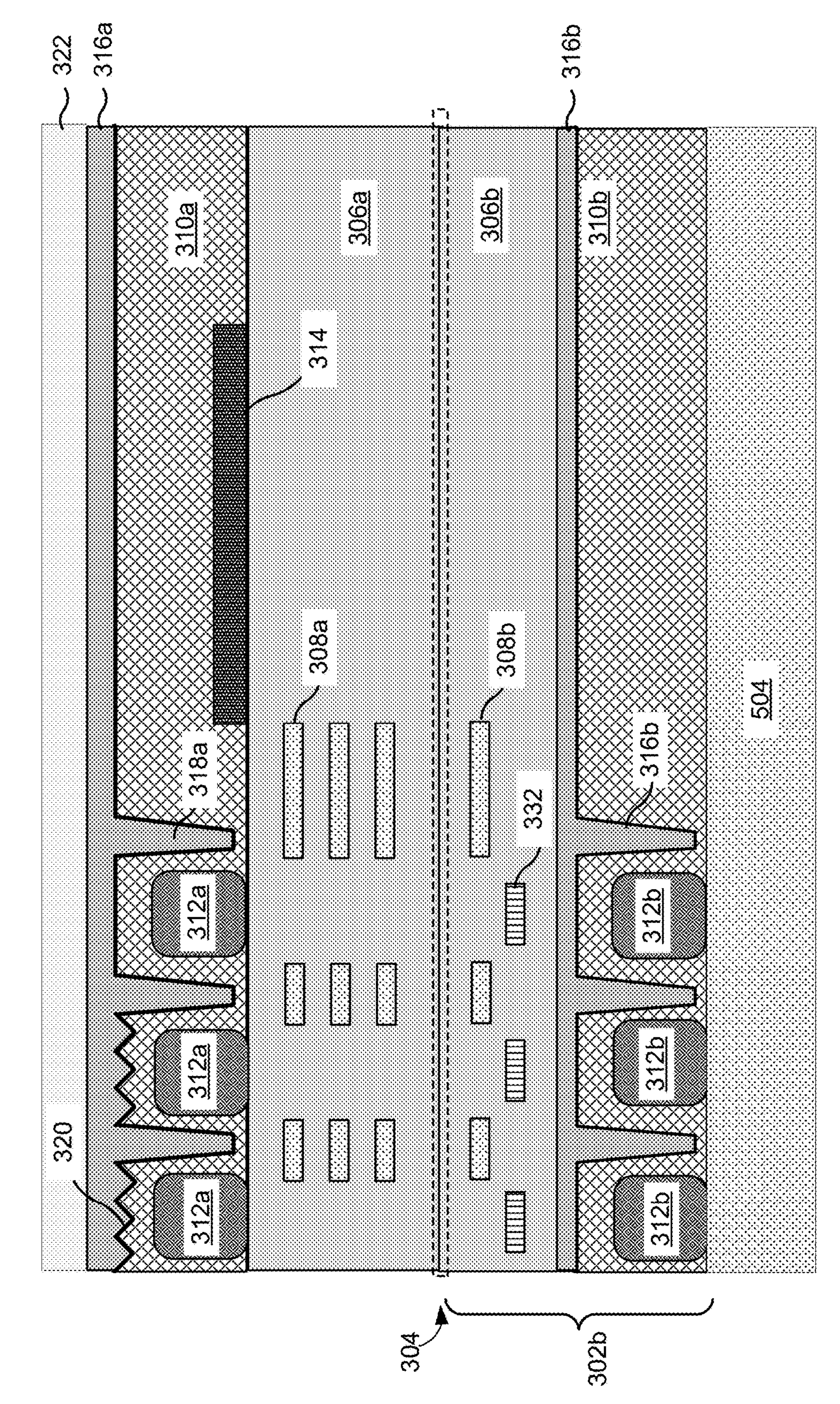
Figure 5O:
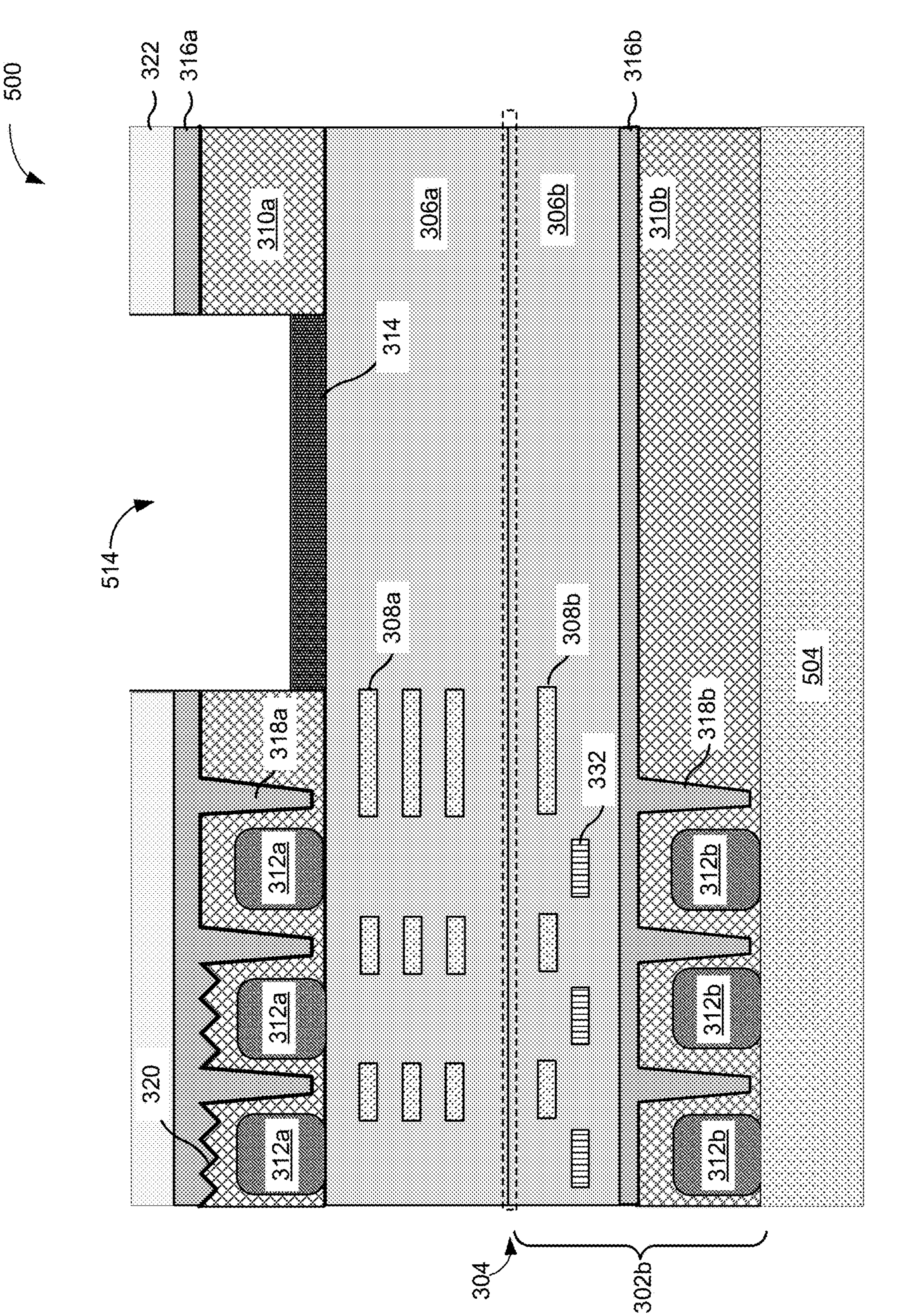
Figure 5P:
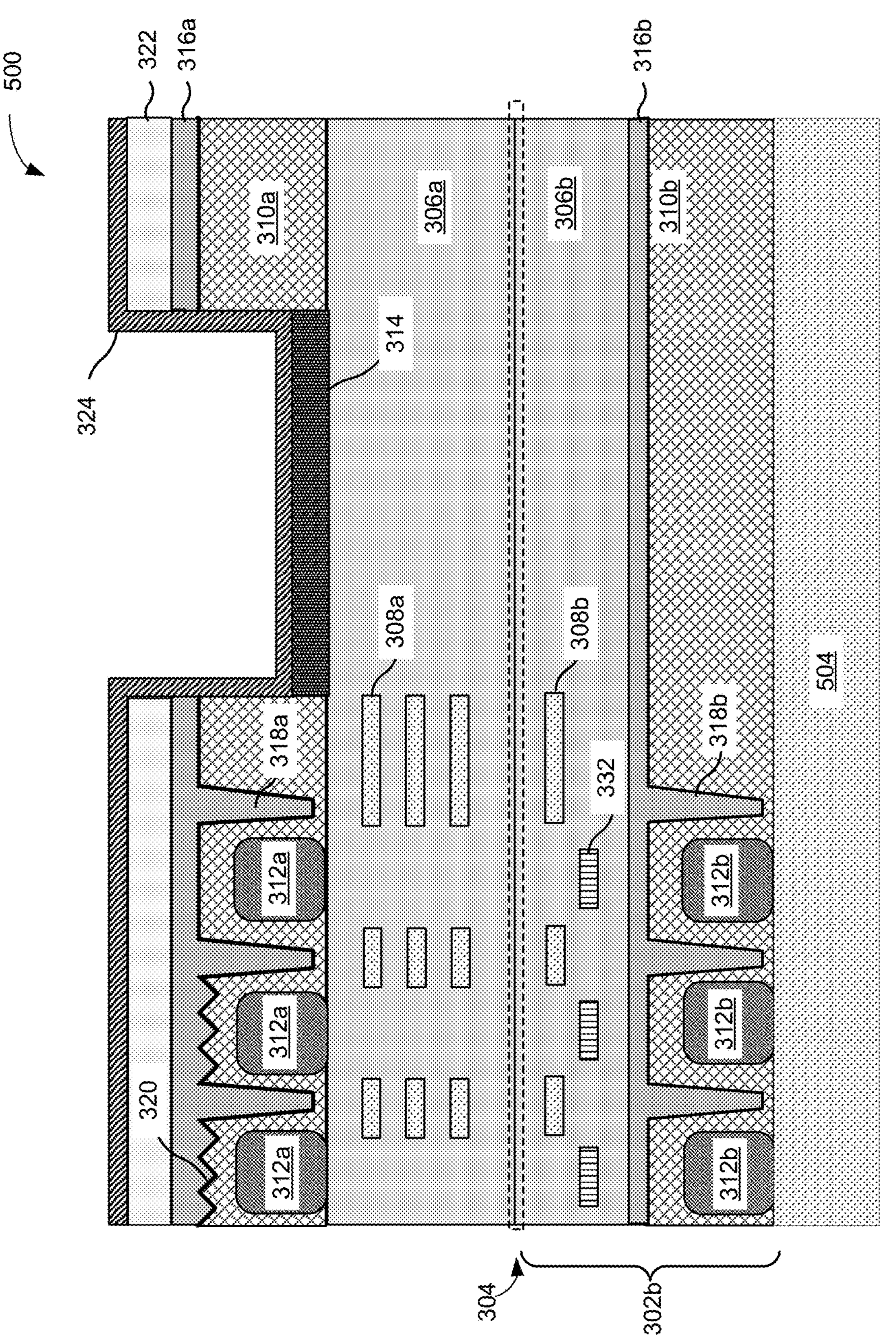
Figure 5Q:
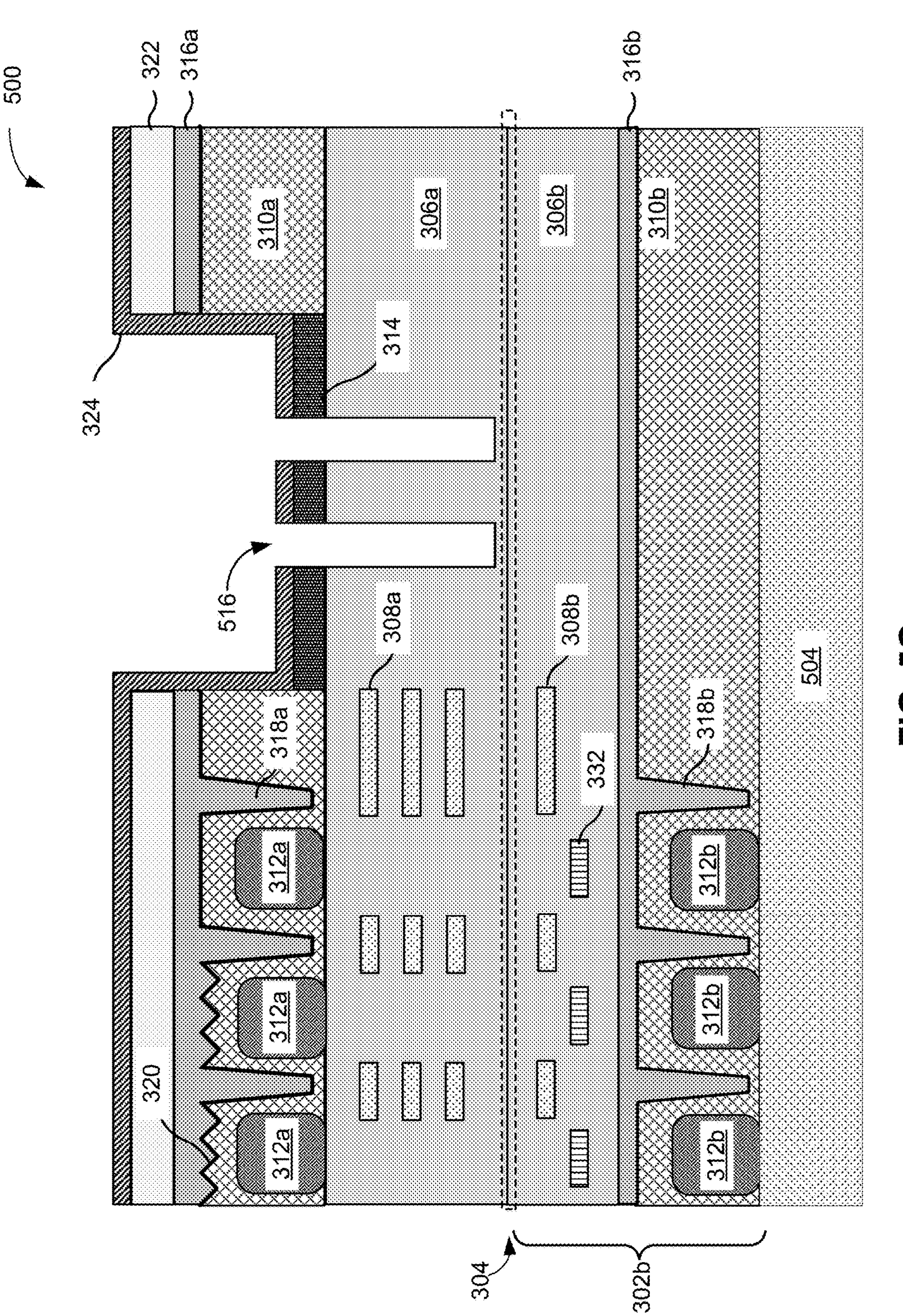
Figure 5R:
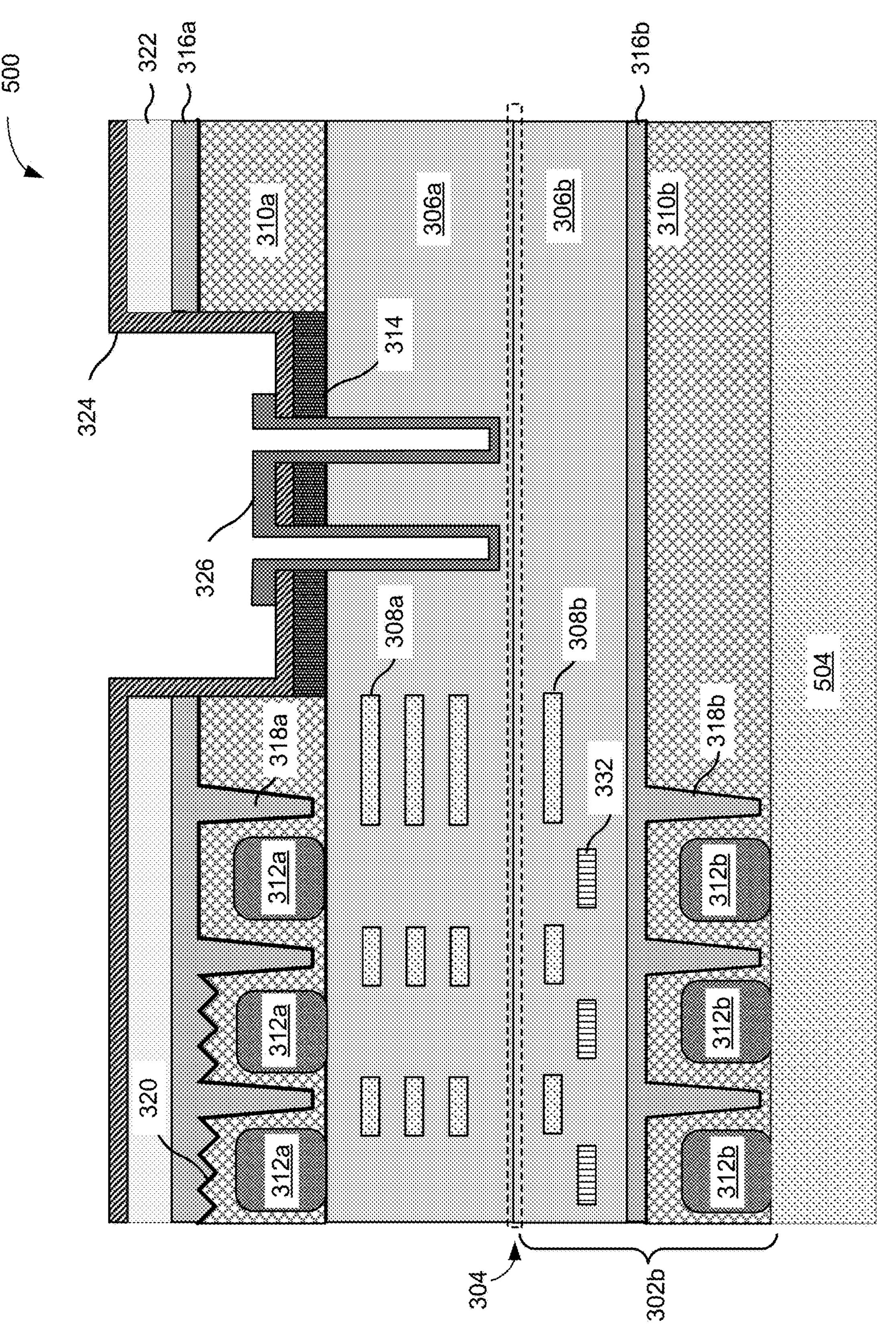
Figure 5S:
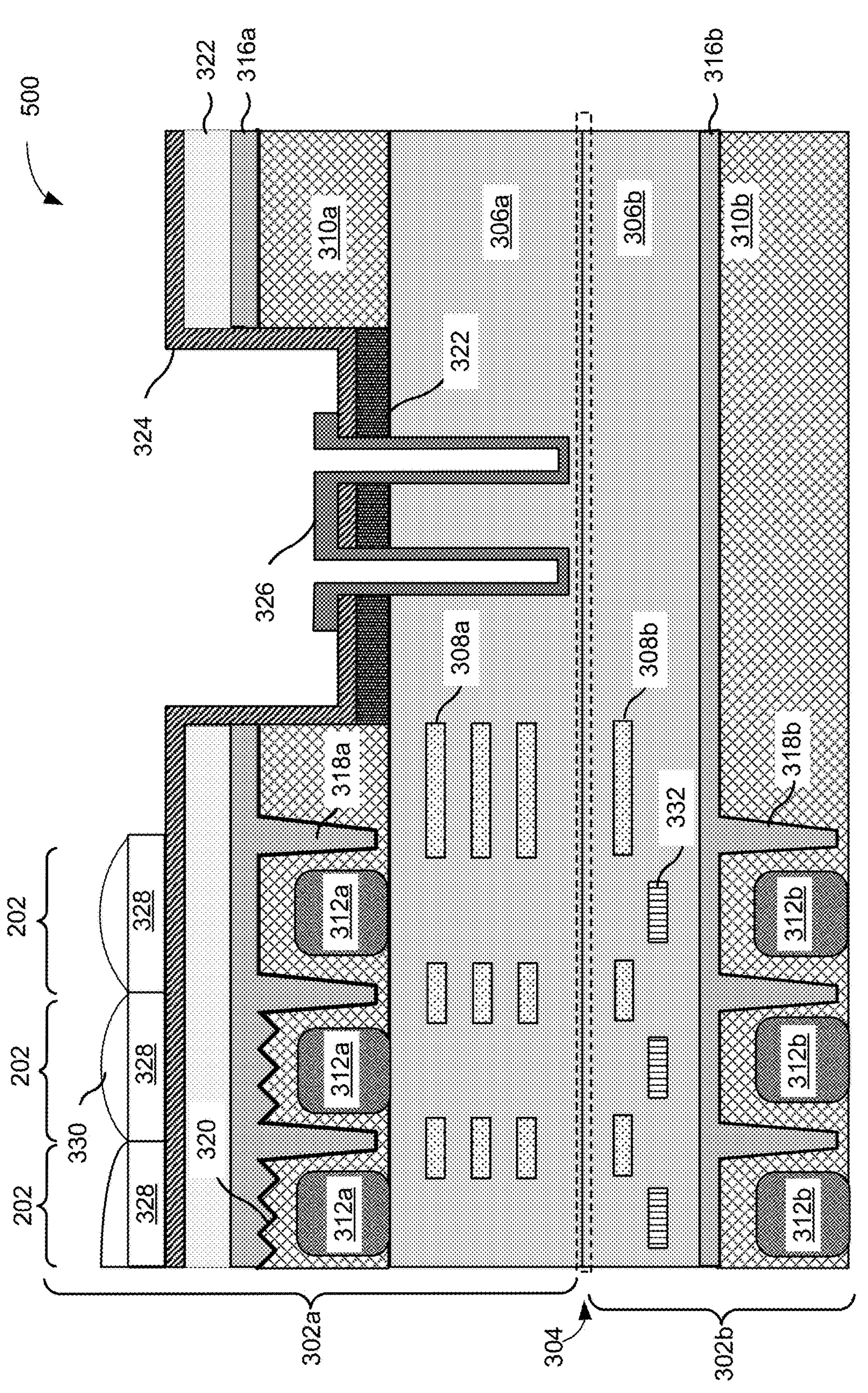

FIGS. 5A-5S are diagrams of an example implementation 500 of forming the optoelectronic 300 device of FIG. 3. As part of the implementation 500, a series of operations may be performed by one or more of the semiconductor processing tools 102-116 and/or the wafer/die transport tool 118 described in connection with FIG. 1.

As shown in FIG. 5A, formation of a first device included in the optoelectronic device 300 (e.g., the device 302*b*) may begin with a carrier structure 502 (e.g., a glass carrier structure or a silicon carrier structure, among other examples) holding the layer of the semiconductor material 310*b*. The deposition tool 102 may deposit the layer of the semiconductor material 310*b* in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the layer of semiconductor material 310*b* after the deposition tool 102 deposits the layer of the semiconductor material 310*b*.

As shown in FIG. 5B, and as part of the series of operations, the photodiode(s) 312*b* maybe formed in the layer of the semiconductor material 310*b*. As an example, the deposition tool 102, the exposure tool 104, the developer tool 106, the etch tool 108, and/or the ion implantation tool 114 may perform a combination of deposition, photolithography, etching, and/or implant operations to implant ions in a defined region below the surface of the substrate to form the photodiode(s) 312*b*.

As shown in FIG. 5C, and as part of the series of operations, layer of the semiconductor material 310*b* including the photodiodes 312-312*b* is transferred to a carrier structure 504 (e.g., a glass carrier structure or a silicon carrier structure, among other examples. As an example, bonding/debonding/debonding tool 116 may separate the layer of the semiconductor material 310*b* from the carrier structure 502 and transfer the layer of the semiconductor material 310*b* to the carrier structure 504.

Turning to FIG. 5D, and as part of the series of operations, the etch tool 108 may form cavities 506 (e.g., cavities for the DTI structures 318*b*) in the layer of the semiconductor material 310*b*. In some implementations, a pattern in a photoresist layer is used to etch the layer of the semiconductor material 310*b* to form the cavities 506. In these implementations, the deposition tool 102 forms the photoresist layer on the layer of the semiconductor material 310*b*. The exposure tool 104 exposes the photoresist layer to a radiation source to pattern the photoresist layer. The developer tool 106 develops and removes portions of the photoresist layer to expose the pattern. The etch tool 108 etches the layer of the semiconductor material 310*b* based on the pattern to form the cavities 510-506 in the layer of the semiconductor material 310*b*. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching the layer of the semiconductor material 310*b* based on a pattern.

As shown in FIG. 5E, the oxide layer 316*b* is formed over and/or on the layer of the semiconductor material 310*b*. The deposition tool 102 may deposit the oxide layer 316*b* in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the oxide layer 316*b* after the deposition tool 102 deposits the oxide layer 316*b*. As part of forming the oxide layer 316*b*, the cavities 506 may be filled with oxide to form the DTI structures 318*b*. In some implementations, the deposition tool 102 deposits an anti-reflective (ARC) layer prior to depositing the oxide layer 316*b*.

As shown in FIG. 5F, a first portion of the dielectric region 306 (e.g., the portion 306*b*1) is formed on and/or over the oxide layer 316*b*. To form the first portion of the dielectric region 306, the deposition tool 102 may deposit one or more layers of a dielectric material in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes one or more of the layers of the dielectric material after the deposition tool 102 deposits one or more layers of the dielectric material.

As further shown in FIG. 5F, and as part of the series of operations, the polarizing mask structure(s) 332 are formed on the first portion of the dielectric region 306. The deposition tool 102 and/or the plating tool 112 may deposit the base layer 406 and/or the capping layer 408 in a CVD operation, a PVD operation, an ALD operation, an electroplating operation, another deposition operation described above in connection with FIG. 1, and/or another suitable deposition operation. In some implementations, the planarization tool 110 planarizes the base layer 406 and/or the capping layer 408 after the deposition tool 102 and/or the plating tool 112 deposits the base layer 406 and/or the capping layer 408.

In some implementations, and as part of forming the polarizing mask structure(s) 332, a pattern in a photoresist layer is used to etch the base layer 406 and/or the capping layer 408 to form the polarizing beam structure(s) 402. In these implementations, the deposition tool 102 forms the photoresist layer on the capping layer 408. The exposure tool 104 exposes the photoresist layer to a radiation source to pattern the photoresist layer. The developer tool 106 develops and removes portions of the photoresist layer to expose the pattern. The etch tool 108 etches the base layer 406 and/or the capping layer 408 based on the pattern to form the polarizing beam structure(s) 402. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique).

Turning to FIG. 5G, a second portion of the dielectric region 306*b* (e.g., the portion 306*b*2) is formed on and/or over the oxide layer 316*b*. To form the second portion of the dielectric region 306*b*, the deposition tool 102 may deposit one or more layers of a dielectric material in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes one or more of the layers of the dielectric material after the deposition tool 102 deposits one or more layers of the dielectric material.

As part of forming the device 302, metallization layers 308*b* are formed within second portion of the dielectric region 306*b* (e.g., the portion 306*b*2). To form the metallization layers 308*b*, the deposition tool 102 and/or the plating tool 112 may deposit the metallization layers 308*b* in a CVD operation, a PVD operation, an ALD operation, an electroplating operation, another deposition operation described above in connection with FIG. 1, and/or another suitable deposition operation. In some implementations, the planarization tool 110 planarizes the metallization layers 308*b* after the deposition tool 102 and/or the plating tool 112 deposits the metallization layers 308*b*.

In some implementations, a pattern in a photoresist layer may be used to etch the metallization layers 308*b* to form the pass-through regions 334*b*. In these implementations, the deposition tool 102 forms the photoresist layer on the metallization layers 308*b*. The exposure tool 104 exposes the photoresist layer to a radiation source to pattern the photoresist layer. The developer tool 106 develops and removes portions of the photoresist layer to expose the pattern. The etch tool 108 etches the metallization layers 308*b* based on the pattern to form the pass-through regions 334*b*. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique).

As shown if FIG. 5H, formation of a second device included in the optoelectronic device 300 (e.g., the device 302*a*). As shown in FIG. 5H, a carrier structure 508 (a glass carrier structure or a silicon carrier structure, among other examples) holds the layer of the semiconductor material 310*a*. The deposition tool 102 may deposit the layer of the semiconductor material 310*a* in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the layer of the semiconductor material 310*a* after the deposition tool 102 deposits the layer of the semiconductor material 310*a*.

As part of the series of operations, the STI region 314 is formed in the layer of the semiconductor material 310*a*. As an example, the deposition tool 102, the exposure tool 104, the developer tool 106, and/or the etch tool 108 may perform a combination of photolithography, etching, and deposition operations to form the STI region 314 in the layer of the semiconductor material 310*a*.

Turning to FIG. 5I, and as part of the series of operations, the photodiode(s) 312*a* are formed in the layer of the semiconductor material 310*a*. As an example, the deposition tool 102, the exposure tool 104, the developer tool 106, the etch tool 108, and/or the ion implantation tool 114 may perform a combination of deposition, photolithography, etching, and/or implant operations to implant ions in a defined region below the surface of the substrate to form the photodiode(s) 312*a*.

As shown in FIG. 5J, the dielectric region 306*a* is formed above and/or on the layer of the semiconductor material 310*a*. As part of forming the dielectric region 306*a*, and as an example, the deposition tool 102 may deposit one or more dielectric layers of the dielectric region 306*a* using a CVD operation, a PVD operation, an ALD operation, another deposition operation described above in connection with FIG. 1, and/or another suitable deposition operation. In some implementations, the planarization tool 110 planarizes the one or more of the dielectric layers after the deposition tool 102 deposits the dielectric layers.

Additionally, or and as part of forming the dielectric region 306*a*, the deposition tool 102, the exposure tool 104, the developer tool 106, and/or the etch tool 108 may perform a combination of deposition, photolithography, and/or etching operations to form the metallization layers 308*a*. To form one or more of the metallization layers, deposition tool 102 and/or the plating tool 112 may deposit one or more of the metallization layers 308*a* in a CVD operation, a PVD operation, an ALD operation, an electroplating operation, another deposition operation described above in connection with FIG. 1, and/or another suitable deposition operation. In some implementations, the planarization tool 110 planarizes one or more of the metallization layers 308 after deposition.

In some implementations, a pattern in a photoresist layer may be used to etch the metallization layers 308*a* to form the pass-through regions 334*a*. In these implementations, the deposition tool 102 forms the photoresist layer on the metallization layers 308*a*. The exposure tool 104 exposes the photoresist layer to a radiation source to pattern the photoresist layer. The developer tool 106 develops and removes portions of the photoresist layer to expose the pattern. The etch tool 108 etches the metallization layers 308*a* based on the pattern to form the pass-through regions 334*a*. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique).

As shown in FIG. 5K, and as part of the series of operations, the bonding/debonding/debonding tool 116 may remove the carrier structure 508 (e.g., separate the carrier structure 508 and the layer of the semiconductor material 310*a*). Furthermore, and as shown in FIG. 5K, the bonding/debonding tool may join the dielectric region 306*b* and a portion of the device 302*a* including the photodiode(s) 312*a*. In some implementations, joining the portion of the device 302*a* including the photodiode(s) 312*a* includes the bonding/debonding/debonding tool 116 performing a eutectic bonding operation to form the bonding interface 304 between the dielectric regions 306*a* and 306*b*. In some implementations, forming the bonding interface 304 includes joining surfaces of conductive materials (e.g., copper materials) and/or dielectric materials at surfaces of the dielectric regions 306*a* and 306*b*.

Turning to FIG. 5L, and as part of the series of operations, the etch tool 108 may form cavities 510 (e.g., cavities for the DTI structures 318*b*) and cavities 512 (e.g., cavities for the HA regions 320). In some implementations, a pattern in a photoresist layer is used to etch the layer of the semiconductor material 310*a* to form the cavities 510 and 512. In these implementations, the deposition tool 102 forms the photoresist layer on the layer of the semiconductor material 310*a*. The exposure tool 104 exposes the photoresist layer to a radiation source to pattern the photoresist layer. The developer tool 106 develops and removes portions of the photoresist layer to expose the pattern. The etch tool 108 etches the layer of the semiconductor material 310*a* based on the pattern to form the cavities 510 and 512 in the layer of the semiconductor material 310*a*. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching the layer of the semiconductor material 310*a* based on a pattern.

As shown in FIG. 5M, the oxide layer 316*a* is formed over and/or on the layer of the semiconductor material 310*a*. The deposition tool 102 may deposit the oxide layer 316*a* in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the oxide layer 316*a* after the deposition tool 102 deposits the oxide layer 316*a*. As part of forming the oxide layer 316*a*, the cavities 510 and 512 may be filled with oxide to form the DTI structures 318*a* and the HA regions 320. In some implementations, the deposition tool 102 deposits an anti-reflective (ARC) layer prior to depositing the oxide layer 316*a*.

As shown in FIG. 5N, the BSI oxide layer 322 is formed over and/or on the oxide layer 316*a*. The deposition tool 102 may deposit the BSI oxide layer 322 in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the BSI oxide layer 322 after the deposition tool 102 deposits the BSI oxide layer 322.

Turning to FIG. 5O, and as part of the series of operations, a cavity 514 is formed through the BSI oxide layer 322, the oxide layer 316*a*, and the layer of the semiconductor material 310*a* to the STI region 314. In some implementations, a pattern in a photoresist layer is used to etch the BSI oxide layer 322, the oxide layer 316*a*, and the layer of the semiconductor material 310*a* to form the cavity 514. In these implementations, the deposition tool 102 forms the photoresist layer on the layer of the semiconductor material 310*a*. The exposure tool 104 exposes the photoresist layer to a radiation source to pattern the photoresist layer. The developer tool 106 develops and removes portions of the photoresist layer to expose the pattern. The etch tool 108 etches the cavity 514 based on the pattern to form the cavity 514 in the BSI oxide layer 322, the oxide layer 316*a*, and the layer of the semiconductor material 310*a*. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching the BSI oxide layer 322, the oxide layer 316*a*, and the layer of the semiconductor material 310*a* based on a pattern.

As shown in FIG. 5P, the buffer oxide layer 324 is formed over and/or on the BSI oxide layer 322. The deposition tool 102 may deposit the buffer oxide layer 324 in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the buffer oxide layer 324 after the deposition tool 102 deposits the buffer oxide layer 324.

As shown FIG. 5Q, cavities 516 are formed through buffer oxide layer 324, through the STI region 314, and into the dielectric region 306*a*. In some implementations, a pattern in a photoresist layer is used to etch the buffer oxide layer 324, the STI region 314, and the dielectric region 306*a* to form the cavities 516. In these implementations, the deposition tool 102 forms the photoresist layer on the buffer oxide layer 324. The exposure tool 104 exposes the photoresist layer to a radiation source to pattern the photoresist layer. The developer tool 106 develops and removes portions of the photoresist layer to expose the pattern. The etch tool 108 etches the buffer oxide layer 324, the STI region 314, and the dielectric region 306*a* based on the pattern to form the cavities 516 through buffer oxide layer 324, through the STI region 314, and into the dielectric region 306*a*. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching the buffer oxide layer 324, the STI region 314, and the dielectric region 306*a* based on a pattern.

As part of the series of operations and as shown in FIG. 5R, the bonding pad 326 is formed in the cavities 516. As an example, the deposition tool 102, the exposure tool 104, the developer tool 106, and/or the etch tool 108 may perform a combination of deposition, photolithography, and/or etching operations to form the bonding pad 326.

Turning to FIG. 5S, and as part of the series of operations, the filter layer 328 and the micro-lens layer 330 are formed over and/or on the buffer oxide layer 324. As an example, the deposition tool 102, the exposure tool 104, the developer tool 106, and/or the etch tool 108 may perform a combination of deposition, photolithography, and/or etching operations to form the filter layer 328 and the micro-lens layer 330.

As indicated above, FIGS. 5A-5S are provided as an example. Other examples may differ from what is described with regard to FIGS. 5A-5S.

Figure 6:
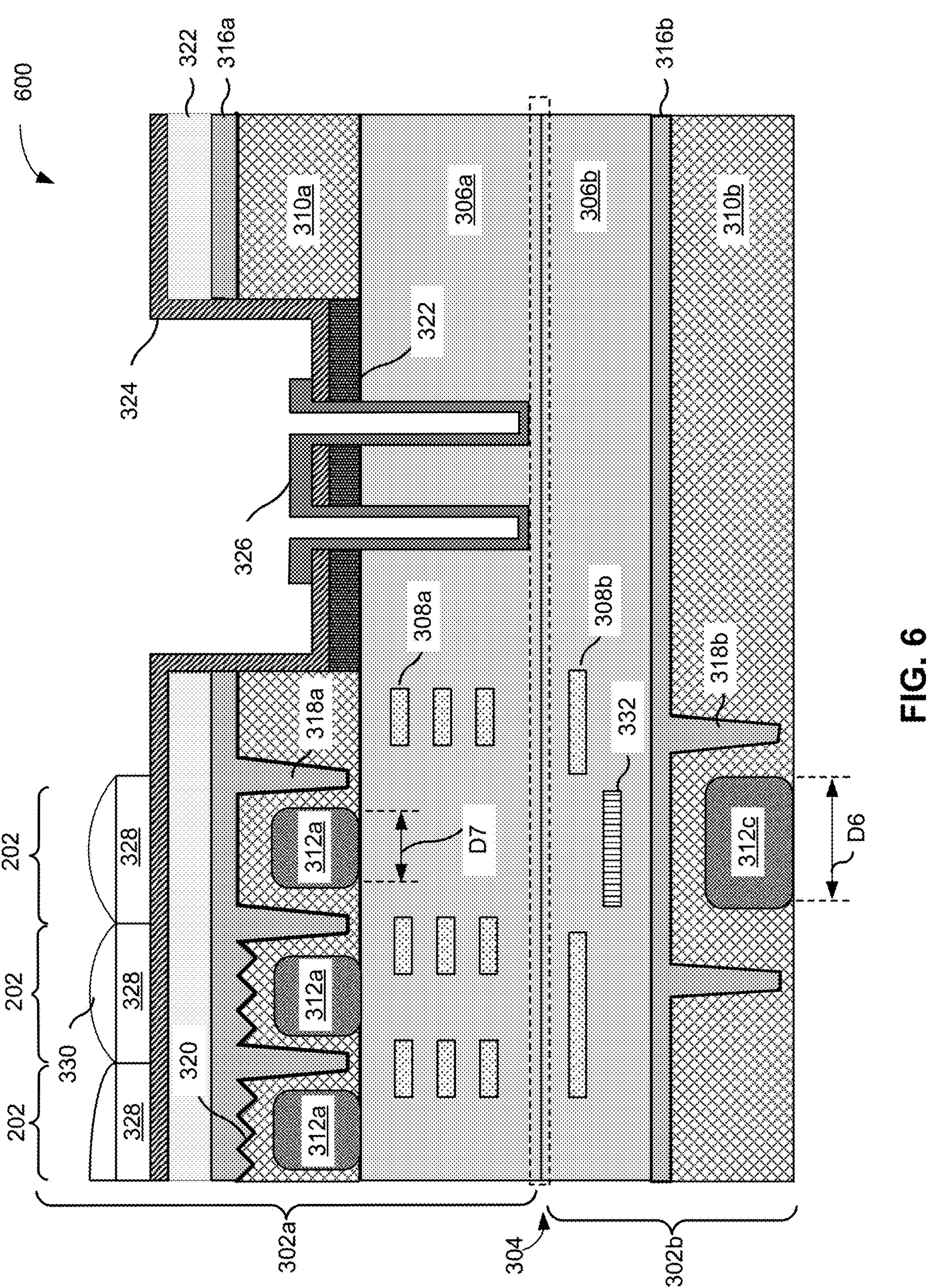
FIG. 6 is a diagram of an example optoelectronic device including a polarizing mask structure described herein.

FIG. 6 is a diagram of an example an example optoelectronic device 600 including the polarizing mask structure(s) 332 described herein. As shown in FIG. 6, the optoelectronic device 600 includes the photodiode(s) 312*a* and the photodiode 312*c*. In the example implementation illustrated in FIG. 6, the example optoelectronic device 600 includes a large polarized NIR light photodiode (e.g., the photodiode 312*c*). The large size of the polarized NIR light photodiode may increase absorption of NIR light and may increase the efficiency of the optoelectronic device 600, among other examples.

In some implementations of the optoelectronic device 600, portions of the device 302*a* including the photodiode(s) 312*a* include materials and/or properties that are conducive to sensing VIS light waves. For example, the layer of the semiconductor material 310*a* may include a silicon material (Si), and the photodiode(s) 312*a* may include a dopant such as a boron dopant (B), an aluminum dopant (Al), a phosphorus dopant (P), or an arsenic dopant (As).

Further, and in some implementations of the optoelectronic device 600, portions of the device 302*b* including the photodiode 312*c* may include materials and/or properties that are conducive to sensing NIR light waves. For example, the layer of the semiconductor material 310*b* may include an indium gallium arsenide material (InGaAs), and the photodiode 312*c* may include a dopant such as a silicon (Si) dopant.

Additionally, or alternatively, a width D6 of the photodiode 312*c* may be greater relative to a width D7 of the photodiode(s) 312*a*. As an example, the width D6 may be included in a range of approximately 2000 nanometers to approximately 2500 nanometers and the width D7 may be included in a range of approximately 500 nanometers to approximately 700 nanometers.

If the width D6 is less than approximately 2000 nanometers, a sensitivity of the photodiode 312*c* (e.g., a sensitivity to NIR light waves) may not satisfy a performance threshold. If the width D6 is greater than approximately 2500 nanometers, a size of the optoelectronic device 300 may increase to not satisfy a sizing threshold and/or increase a cost of the optoelectronic device. However, other values and ranges for the width D6 are within the scope of the present disclosure.

Additionally, or alternatively, if the width D7 is less than approximately 500 nanometers, a sensitivity of the photodiode(s) 312*a* (e.g., a sensitivity to VIS light waves) may not satisfy a performance threshold. If the width D7 is greater than approximately 700 nanometers, a size of an array of pixels including the photodiode(s) 312*a* (e.g., a size of the pixel array 200) may increase to not satisfy a sizing threshold and/or increase a cost the optoelectronic device. However, other values and ranges for the width D7 are within the scope of the present disclosure.

In some implementations, and as shown in FIG. 6, the device 302*b* includes least one isolation structure (e.g., the DIT structure 318*b*) below the polarizing mask structure(s) 332 and adjacent to a side of the photodiode 312*c*. Further, and as shown in FIG. 6, the photodiode 312*c*, the polarizing mask structure(s) 332, and a photodiode (of the photodiode(s) 312*a*) are vertically aligned (e.g., aligned coaxially).

As indicated above, FIG. 6 is provided an example. Other examples may differ from what is described with regard to FIG. 6.

Figure 7:
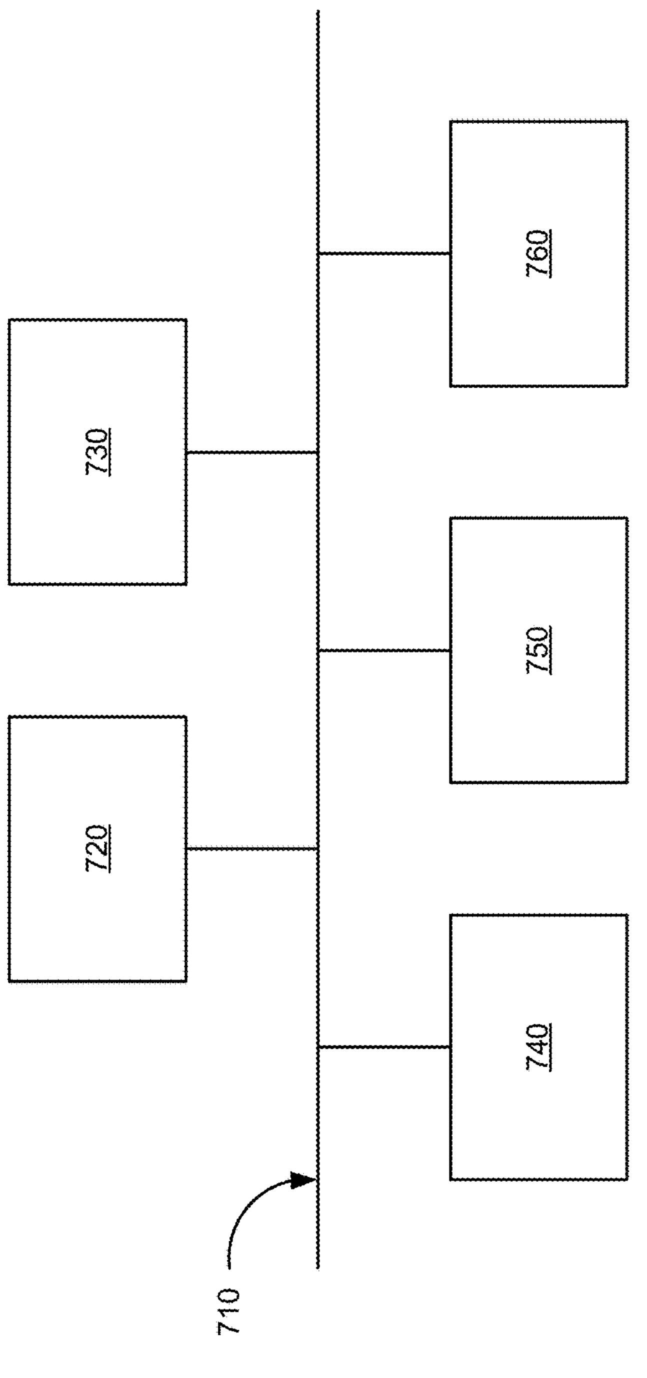
FIG. 7 is a diagram of example components of one or more devices of FIG. 1 described herein.

FIG. 7 is a diagram of example components of one or more devices of FIG. 1 described herein. The device 700 may correspond to one or more of the semiconductor processing tools 102-116 and/or the wafer/die transport tool 118. In some implementations, one or more of the semiconductor processing tools 102-116 and/or the wafer/die transport tool 118 may include one or more devices 700 and/or one or more components of the device 700. As shown in FIG. 7, the device 700 may include a bus 710, a processor

720, a memory 730, an input component 740, an output component 750, and/or a communication component 760.

The bus 710 may include one or more components that enable wired and/or wireless communication among the components of the device 700. The bus 710 may couple together two or more components of FIG. 7, such as via operative coupling, communicative coupling, electronic coupling, and/or electric coupling. For example, the bus 710 may include an electrical connection (e.g., a wire, a trace, and/or a lead) and/or a wireless bus. The processor 720 may include a central processing unit, a graphics processing unit, a microprocessor, a controller, a microcontroller, a digital signal processor, a field-programmable gate array, an application-specific integrated circuit, and/or another type of processing component. The processor 720 may be implemented in hardware, firmware, or a combination of hardware and software. In some implementations, the processor 720 may include one or more processors capable of being programmed to perform one or more operations or processes described elsewhere herein.

The memory 730 may include volatile and/or nonvolatile memory. For example, the memory 730 may include random access memory (RAM), read only memory (ROM), a hard disk drive, and/or another type of memory (e.g., a flash memory, a magnetic memory, and/or an optical memory). The memory 730 may include internal memory (e.g., RAM, ROM, or a hard disk drive) and/or removable memory (e.g., removable via a universal serial bus connection). The memory 730 may be a non-transitory computer-readable medium. The memory 730 may store information, one or more instructions, and/or software (e.g., one or more software applications) related to the operation of the device 700. In some implementations, the memory 730 may include one or more memories that are coupled (e.g., communicatively coupled) to one or more processors (e.g., processor 720), such as via the bus 710. Communicative coupling between a processor 720 and a memory 730 may enable the processor 720 to read and/or process information stored in the memory 730 and/or to store information in the memory 730.

The input component 740 may enable the device 700 to receive input, such as user input and/or sensed input. For example, the input component 740 may include a touch screen, a keyboard, a keypad, a mouse, a button, a microphone, a switch, a sensor, a global positioning system sensor, a global navigation satellite system sensor, an accelerometer, a gyroscope, and/or an actuator. The output component 750 may enable the device 700 to provide output, such as via a display, a speaker, and/or a light-emitting diode. The communication component 760 may enable the device 700 to communicate with other devices via a wired connection and/or a wireless connection. For example, the communication component 760 may include a receiver, a transmitter, a transceiver, a modem, a network interface card, and/or an antenna.

The device 700 may perform one or more operations or processes described herein. For example, a non-transitory computer-readable medium (e.g., memory 730) may store a set of instructions (e.g., one or more instructions or code) for execution by the processor 720. The processor 720 may execute the set of instructions to perform one or more operations or processes described herein. In some implementations, execution of the set of instructions, by one or more processors 720, causes the one or more processors 720 and/or the device 700 to perform one or more operations or processes described herein. In some implementations, hardwired circuitry may be used instead of or in combination with the instructions to perform one or more operations or processes described herein. Additionally, or alternatively, the processor 720 may be configured to perform one or more operations or processes described herein. Thus, implementations described herein are not limited to any specific combination of hardware circuitry and software.

The number and arrangement of components shown in FIG. 7 are provided as an example. The device 700 may include additional components, fewer components, different components, or differently arranged components than those shown in FIG. 7. Additionally, or alternatively, a set of components (e.g., one or more components) of the device 700 may perform one or more functions described as being performed by another set of components of the device 700.

Figure 8:
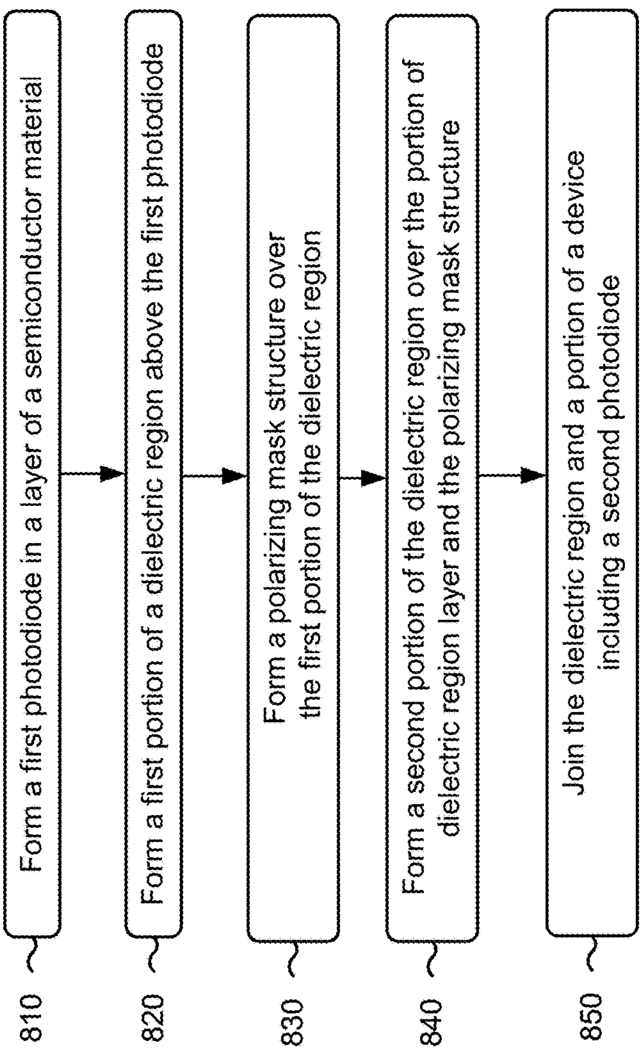
FIG. 8 is a flowchart of an example process associated with forming an optoelectronic device including a polarizing mask structure.

FIG. 8 is a flowchart of an example process 800 associated with forming an optoelectronic device including a polarizing mask structure. In some implementations, one or more process blocks of FIG. 8 are performed by one or more semiconductor processing tools (e.g., one or more of the semiconductor processing tools 102-116). Additionally, or alternatively, one or more process blocks of FIG. 8 may be performed by one or more components of device 700, such as processor 720, memory 730, input component 740, output component 750, and/or communication component 760.

As shown in FIG. 8, process 800 may include forming a first photodiode in a layer of a semiconductor material (block 810). For example, one or more of the semiconductor processing tools 102-116 may form a first photodiode (e.g., the photodiode(s) 312*b*) in a layer of a semiconductor material (e.g., the layer of the semiconductor material 310*b*), as described herein.

As further shown in FIG. 8, process 800 may include forming a first portion of a dielectric region above the first photodiode (block 820). For example, one or more of the semiconductor processing tools 102-116 may form a first portion of a dielectric region (e.g., the portion 306*b*1 of the dielectric region 306*b*) above the first photodiode, as described herein.

As further shown in FIG. 8, process 800 may include forming a polarizing mask structure over the first portion of the dielectric region (block 830). For example, one or more of the semiconductor processing tools 102-116 may form a polarizing mask structure (e.g., the polarizing mask structure(s) 332) over the first portion of the dielectric region, as described herein. In some implementations, forming the polarizing mask structure over the first portion of the dielectric region includes vertically aligning the polarizing mask structure and the first photodiode.

As further shown in FIG. 8, process 800 may include forming a second portion of the dielectric region over the first portion of the dielectric region and over the polarizing mask structure (block 840). For example, one or more of the semiconductor processing tools 102-116 may form a second portion of the dielectric region (e.g., the portion 306*b*2 of the dielectric region 306*b*) over the first portion of the dielectric region and over the polarizing mask structure, as described herein.

As further shown in FIG. 8, process 800 may include joining the dielectric region and a portion of a device including a second photodiode (block 850). For example, one or more of the semiconductor processing tools 102-116 may join the dielectric region (e.g., the dielectric region 306) and a portion of a device including a second photodiode (e.g., a portion of the device 302*a* including the photodiode(s) 312*a*), as described herein. In some implementations, joining the dielectric region and the device including the second photodiode includes vertically aligning the second photodiode and the polarizing mask structure.

Process 800 may include additional implementations, such as any single implementation or any combination of implementations described below and/or in connection with one or more other processes described elsewhere herein.

In a first implementation, forming the polarizing mask structure on the first portion of the dielectric region includes forming a base layer (e.g., the base layer 406) on the first portion of the dielectric region, forming a capping layer (e.g., the capping layer 408) on the base layer, and removing portions of the base layer and the capping layer to form an array of polarizing beam structures (e.g., the polarizing beam structure(s) 402) dispersed along axes that are approximately parallel to a polarizing axis (e.g., the polarizing axis 404), where the array of polarizing beam structures include remaining portions of the capping layer over remaining portions of the base layer.

In a second implementation, alone or in combination with the first implementation, joining the dielectric region and the device including the second photodiode includes joining the dielectric region and the device including the second photodiode using a eutectic bonding process.

In a third implementation, alone or in combination with one or more of the first and second implementations, process 800 includes forming a light wave filter structure (e.g., the filter layer 328) over the second photodiode, where forming the light wave filter structure over the second photodiode includes vertically aligning the light wave filter structure and the polarizing mask structure.

In a fourth implementation, alone or in combination with one or more of the first through third implementations, process 800 includes forming a metallization layer (e.g., the metallization layer(s) 308*a*) in the second portion of the device region above the polarizing mask structure.

In a fifth implementation, alone or in combination with one or more of the first through fourth implementations, forming the metallization layer in the second portion of the dielectric region above the polarizing mask structure includes forming a pass-through region (e.g., the pass-through region 334*a*) between segments of the metallization layer, where forming the pass-through region includes vertically aligning the pass-through region and the polarizing mask structure.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

Some implementations described herein include a CIS device and techniques to form the CIS device. The CIS device includes a includes a first array of photodiodes stacked over a second array of photodiodes. A polarization structure is between the first array of photodiodes and the second array of photodiodes. Signaling generated by the first array of photodiodes (e.g., signaling corresponding to unpolarized light waves) may be multiplexed with signaling generated by the second array of photodiodes (e.g., signaling corresponding to polarized light waves). The CIS device further includes a filter structure that filters VIS light waves and NIR light waves amongst the first array of photodiodes and the second array of photodiodes.

In this way, reflected light waves from a target object that includes unpolarized VIS light waves, polarized VIS light waves, unpolarized NIR light waves, and/or polarized NIR light waves are simultaneously captured by a single CIS device. As such, a performance of an image processing system that multiplexes the simultaneously captured unpolarized VIS light waves, the polarized VIS light waves, the unpolarized NIR light waves, and/or the polarized NIR light waves may be improved relative to another image processing system that multiplexes unpolarized VIS light waves and unpolarized NIR light waves that may be captured by separate and discrete devices with timing offsets. This improved performance results in a reduction of an amount of computing resources needed by the image processing system. Additionally, and by combining unpolarized VIS light detection capabilities, polarized VIS light detection capabilities, unpolarized NIR light detection capabilities, and polarized NIR light detection capabilities in a single CIS device, an amount of semiconductor manufacturing resources needed to manufacture the image processing system is reduced (e.g., semiconductor manufacturing tools, raw materials, manpower, and/or computing resources).

As described in greater detail above, some implementations described herein provide a device. The device includes a light wave filter structure. The device includes a first photodiode in a first device region below the light wave filter structure. The device includes a second photodiode in a second device region below the first photodiode. The device includes a polarizing mask structure between the first photodiode and the second photodiode.

As described in greater detail above, some implementations described herein provide a device. The device includes a light wave filter structure having a transmissivity that allows red visible light waves and near infrared light waves to pass through the light wave filter structure. The device includes a red visible light photodiode in a first device region below the light wave filter structure. The device includes a near infrared light photodiode in a second device region below the red visible light photodiode. The device includes a polarizing mask structure between the red visible light photodiode and the near infrared light photodiode.

As described in greater detail above, some implementations described herein provide a method. The method includes forming a first photodiode in a layer of a semiconductor material. The method includes forming a first portion of a dielectric region above the first photodiode. The method includes forming a polarizing mask structure over the first portion of the dielectric region, where forming the polarizing mask structure over the first portion of the dielectric region includes vertically aligning the polarizing mask structure and the first photodiode. The method includes forming a second portion of the dielectric region over the first portion of the dielectric region and over the polarizing mask structure. The method includes joining the dielectric region and a portion of a device including a second photodiode, where joining the dielectric region and the portion of the device including the second photodiode includes vertically aligning the second photodiode and the polarizing mask structure.

As used herein, the term "and/or," when used in connection with a plurality of items, is intended to cover each of the plurality of items alone and any and all combinations of the plurality of items. For example, "A and/or B" covers "A and B," "A and not B," and "B and not A."

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a first photodiode in a layer of a semiconductor material;

forming a first portion of a dielectric region above the first photodiode;

forming a polarizing mask structure within the first portion of the dielectric region, wherein forming the polarizing mask structure over the first portion of the dielectric region includes vertically aligning the polarizing mask structure and the first photodiode;

forming a second portion of the dielectric region over the first portion of the dielectric region and over the polarizing mask structure;

forming a portion of a device including a second photodiode;

forming a first pass-through region in the second portion of the dielectric region that allows light waves to pass from the second photodiode to the first portion of the dielectric region;

forming a second pass-through region in the first portion of the dielectric region that allow the light waves to pass through the polarizing mask structure to the first photodiode; and joining, by a bonding process, the dielectric region and the portion of the device including the second photodiode, wherein joining the dielectric region and the portion of the device including the second photodiode includes vertically aligning the first photodiode, the second photodiode, and the polarizing mask structure between the first photodiode and the second photodiode, and wherein the first pass-through region is vertically aligned with the second pass-through region and the polarizing mask structure.

2. The method of claim 1, wherein forming the polarizing mask structure on the first portion of the dielectric region comprises:

forming a base layer on the first portion of the dielectric region;

forming a capping layer on the base layer; and removing portions of the base layer and the capping layer to form an array of polarizing beam structures dispersed along axes that are approximately parallel to a polarizing axis, wherein the array of polarizing beam structures include remaining portions of the capping layer over remaining portions of the base layer.

3. The method of claim 1, wherein joining the dielectric region and the portion of the device including the second photodiode comprises:

joining the dielectric region and the portion of the device including the second photodiode using a eutectic bonding process.

4. The method of claim 1, further comprising:

forming a light wave filter structure over the second photodiode, wherein forming the light wave filter structure over the second photodiode includes vertically aligning the light wave filter structure and the polarizing mask structure.

5. The method of claim 1, further comprising:

forming a metallization layer in the second portion of the dielectric region above the polarizing mask structure.

6. The method of claim 5, wherein forming the metallization layer in the second portion of the dielectric region above the polarizing mask structure comprises:

forming the first pass-through region between segments of the metallization layer.

7. The method of claim 4, wherein the light wave filter structure has a transmissivity that allows visible light waves and near infrared light waves to pass through the light wave filter structure.

8. The method of claim 1, wherein first photodiode is a visible light wave photodiode.

9. The method of claim 1, wherein second photodiode is a near infrared light wave photodiode.

10. The method of claim 4, wherein the light wave filter structure is configured to block electromagnetic waves having a wavelength of less than approximately 600 nanometers, and to block electromagnetic waves having a wavelength of greater than approximately 1000 nanometers.

11. A method, comprising:

forming a light wave filter structure having a transmissivity that allows visible light waves and near infrared light waves to pass through the light wave filter structure;

forming a visible light photodiode in a first device region below the light wave filter structure;

forming a near infrared light photodiode in a second device region below the visible light photodiode;

forming a polarizing mask structure in the second device region between the visible light photodiode and the near infrared light photodiode;

forming a first pass-through region in the first device region that allow light waves to pass from the visible light photodiode to the second device region, forming a second pass-through region in the second device region that allow the light waves to pass through the polarizing mask structure to the near infrared light photodiode; and wherein the first pass-through region is vertically aligning the second pass-through region and the polarizing mask structure.

12. The method of claim 11, wherein the light wave filter structure is configured to:

block electromagnetic waves having a wavelength of less than approximately 600 nanometers, and block electromagnetic waves having a wavelength of greater than approximately 1000 nanometers.

13. The method of claim 11, wherein a width of the near infrared light photodiode is greater than a width of the visible light photodiode.

14. The method of claim 11, wherein the polarizing mask structure comprises an array of polarizing beam structures dispersed along axes that are approximately parallel to a polarizing axis.

15. The method of claim 14, wherein each polarizing beam structure of the array of polarizing beam structures comprises a base layer of a first material, and a capping layer of a second material.

16. The method of claim 15, wherein the base layer of the first material comprises a titanium material.

17. The method of claim 15, wherein the capping layer of the second material comprises:
a gold material,
a copper material,
a nickel-cobalt material, or
a nickel-iron material.

18. A method, comprising:
forming a light wave filter structure;
forming a first photodiode in a first device region below the light wave filter structure;
forming a second photodiode in a second device region below the first photodiode;
forming a polarizing mask structure in the second device region between the first photodiode and the second photodiode,
forming a first pass-through region in the first device region that allow light waves to pass from the first photodiode to the second device region,
forming a second pass-through region in the second device region that allow the light waves to pass through the polarizing mask structure to the second photodiode;
wherein the first pass-through region is vertically aligning the second pass-through region and the polarizing mask structure; and
wherein the first photodiode and the second photodiode are near infrared photodiodes, or the first photodiode and the second photodiode are visible light photodiodes.

19. The method of claim 18, further comprising:
forming a first dielectric region comprising first metallization layers,
wherein the first dielectric region is below the first device region; and
forming a second dielectric region comprising second metallization layers and the polarizing mask structure,
wherein the second dielectric region is below the first dielectric region and above the second device region.

20. The method of claim 19
wherein the first dielectric region comprises:
the first pass-through region that allow light waves to pass between segments of the first metallization layers and to the second dielectric region, and wherein the second dielectric region comprises:
the second pass-through region that allow the light waves to pass between segments of the second metallization layers and into the polarizing mask structure.

* * * * *